(12) United States Patent
Moore et al.

(10) Patent No.: US 6,635,228 B1
(45) Date of Patent: Oct. 21, 2003

(54) FALLING FILM PLASMA REACTOR

(75) Inventors: Robert R. Moore, 667 Marshall Ct., Vacaville, CA (US) 95687; James D. Getty, Vacaville, CA (US)

(73) Assignee: Robert R. Moore, Portland, OR (US)

( * ) Notice: Subject to any disclaimer, the term of this patent is extended or adjusted under 35 U.S.C. 154(b) by 184 days.

(21) Appl. No.: 09/703,478

(22) Filed: Oct. 31, 2000

Related U.S. Application Data

(60) Provisional application No. 60/162,918, filed on Nov. 1, 1999.

(51) Int. Cl.[7] ................................. B01J 19/08
(52) U.S. Cl. ................................. 422/186.04
(58) Field of Search ..................... 422/186.04

(56) References Cited

U.S. PATENT DOCUMENTS

| | | |
|---|---|---|
| 3,960,682 A | 6/1976 | Baranova et al. |
| 4,208,373 A | 6/1980 | Matovich |
| 4,344,770 A | 8/1982 | Capener et al. |
| 4,489,041 A | 12/1984 | Wong et al. |
| 4,808,264 A | 2/1989 | Kignell |
| 4,857,132 A | 8/1989 | Fisher |
| 4,906,328 A | 3/1990 | Freeman et al. |
| 4,948,402 A | 8/1990 | Davis |
| 4,949,671 A | 8/1990 | Davis et al. |
| 4,954,320 A | 9/1990 | Birmingham et al. |
| 5,399,832 A * | 3/1995 | Tanisaki et al. ....... 219/121.47 |
| 5,863,510 A | 1/1999 | Pozniak et al. |
| 5,938,422 A | 8/1999 | Smith et al. |
| 5,955,037 A | 9/1999 | Holst et al. |

* cited by examiner

*Primary Examiner*—Kishor Mayekar
(74) *Attorney, Agent, or Firm*—Bacon & Thomas, PLLC

(57) ABSTRACT

A falling film plasma reactor (FFPR) provides a number of benefits for the treatment of process gases. The falling film plasma reactor uses high voltage alternating current or pulsed direct current which is applied to radially separated electrodes to thereby create a dielectric breakdown of the process gas that is flowing within the large radial gap between the two electrodes. Typical plasma reactors often utilize fixed dielectric construction which can result in potential failure of the device by arcing between the electrodes as portions of the dielectric fail. Such failures are prevented by using a dielectric liquid that constantly flows over the electrodes, or over a fixed dielectric barrier over the electrodes.

7 Claims, 25 Drawing Sheets

FALLING FILM PLASMA REACTOR

CROSS-REFERENCE TO RELATED APPLICATIONS

This application claims priority from U.S. provisional application Ser. No. 60/162,918 filed on Nov. 1, 1999, incorporated herein by reference.

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Field of the Invention

This invention pertains generally to chemical treatment systems, and more particularly to a modular point of use chemical treatment system that permits individual treatment of specific chemical process mixtures.

2. Description of the Background Art

Several point-of-use chemical treatment systems are commercially available which utilize thermal, wet scrubbing, dry scrubbing, catalytic, or plasma technologies. However, the current implementations of these technologies tend to suffer from poor economic feasibility or low chemical treatment efficiency due to the need for multiple and simultaneous treatment of specific chemical process mixtures. Many equipment manufacturers accommodate the need for process specific treatment solutions by offering several different products, based upon different technology implementations, that provide solutions for individual specific process mixtures and not for multiple process mixtures. Because of the vast number of different process streams that may need to be treated, a commensurate number of standalone abatement technologies and systems have been developed, most notably those that are described in the following discussion.

Thermal reactors utilize a variety of means to heat chemical process mixtures to high equilibrium temperatures. In addition, reagent gases are added to promote specific reaction chemistries; for example, oxygen or air can be added to promote oxidation. The chemical process mixture can be heated upon contact with a hot surface or through mixing with hot gas. However, hot surface reactors are greatly susceptible to corrosion failure and material accumulation leading to clogging. Common hot gas reactors utilize combustion to heat and react the chemical process mixture in the gas phase. Combustion systems are extremely sensitive to fuel gas and oxidizing gas control and mixing. Corrosion and material accumulation on injection nozzles and igniters result in degraded performance of these systems unless frequent maintenance is performed. A significant expense and liability associated with combustion systems is the piping of fuel gas (specific to the combustion reactor) throughout the manufacturing facility to permit equipment installation.

Glow discharge plasmas are capable of depositing much of their applied power into the gaseous medium to achieve a high percentage of ionization or dielectric breakdown. Such devices operating with electrode potentials of several hundred volts can deposit several kilowatts of power using high frequency alternating current. Consequently, plasma processes creating energetic electrons, ions, reactive neutrals, and radical species can be promoted in these devices. Complex and diverse plasma chemistries can be conducted, but only at low relative pressures, typically 1 millitorr to 10 torr. Coupling power into the gas stream becomes difficult above these pressures resulting in non-uniform dielectric breakdown and collapse of the plasma region to the electrode (inductively coupled) or electrodes (capacitively coupled) of these devices. Because low pressure operation requires pumping systems, the chemical throughput is directly dependent upon both the scale of the pumping system and the ability to apply high frequency power. In addition, changes to the electrode material or geometry occur as a result of corrosion and material accumulation. Such changes interfere with power coupling to the plasma as a result of detuning and energy dissipation by deposited materials. Chemical processing applications have been limited to low flow gas processing such as chemical vapor deposition, gas phase chemical etching, gas phase spectroscopy, or surface treatment of materials such as fibers and films.

Microwave plasmas are also limited to low pressure operation. As pressures approach 100 torr, the inability to propagate and tune coherent waves limits the ability to deposit energy within a resonant cavity resulting in plasma collapse to the cavity surface. As low pressure operation requires a pumping system, the chemical throughput is again directly dependent upon both the scale of the pumping system and the ability to couple high frequency power. In addition, changes to the cavity material or geometry occur as a result of corrosion and material accumulation. Such changes interfere with power coupling to the plasma by changing the modes of TE and TM fields propagated within the cavity.

Silent discharge plasmas are capable of operating at relatively high gas pressures, typically above one atmosphere. Dielectric breakdown of gases between electrodes with a relatively large separation can be achieved using high voltage potentials. However, such devices require a dielectric barrier between the electrodes and the gas stream to prevent collapse of the plasma due to arcing. The electrical resistance of the dielectric barrier enhances capacitive coupling of power to the plasma, but this resistance also limits the current flow through these devices. While silent discharge plasmas are capable of promoting complex chemistries, plasma chemical activity diminishes dramatically as a function of increased gas flow. Minimizing the dielectric strength of the electrode barrier by placing dielectric material throughout the discharge gap has provided enhanced power deposition, but the complexities of surface reaction chemistries as well as physical fouling are increased. Thus, catastrophic arcing remains the principal failure mode and limiting factor in power deposition within these plasma devices.

Catalytic reactors require moderately high temperatures to promote chemical reactions and desorb reaction products from the catalyst surface. The process gas is preheated by either hot surface contact or gas phase combustion. Therefore, maintenance considerations for the preheating section of the system are similar to those for thermal reactors. Additionally, reaction products can poison the catalyst surface by forming a physical barrier or by chemically bonding to the surface. Where reaction products remain as solids even at high temperatures, physical poisoning occurs. Additionally, locations where reaction products are highly oxidizing or capable of forming stable salts upon reaction with the catalyst, chemical poisoning occurs.

Wet scrubbers require relatively meager amounts of energy for operation since their functionality extends from the inherent chemical affinity between the scrubbing solution and the process gases being treated. Both chemical reactivity and solubility are principle parameters effecting the efficiency and capacity of the scrubbing process. Mass transfer is the physical parameter most important to the efficiency of the scrubbing process. Two primary distinctions are important to properly applying wet scrubbing technology: (1) simple liquid with or without additional reagents, and (2) low energy or high energy. The first distinction dictates the ability to satisfy the chemical parameters for scrubbing when treating specific gases. The second distinction dictates the ability to ensure the requisite physical contact between gaseous or particulate matter and the scrubbing liquid to effect removal. Treatment requirements that create difficulties for wet scrubbers are hazardous process mixtures comprising both gaseous and particulate matter where some of the gases are largely insoluble in the scrubbing liquid such that insufficient reaction occurs with the specific reagents, and particulate having diameters in the nanometer to submicron range is thereby formed prior to, or during, the scrubbing process.

Dry scrubbers vary greatly with regard to energy requirements which range from a simple fixed bed adsorption system having low power consumption levels, to a heated reagent bed having a power consumption which approaches that of a catalytic system. Pressure swing or temperature swing adsorption systems have not been feasible for treating complex and reactive gas mixtures and are, therefore, not discussed. Primary distinctions between various dry scrubbers are physical adsorption, and chemical adsorption. Physical adsorption refers to condensation or molecular trapping processes which occur within the requisite material matrix. Chemical adsorption refers to a combination of physical adsorption and surface chemical reaction processes which bind the molecules of concern to the requisite material matrix. Often chemical adsorption systems require added thermal energy to promote the necessary surface reactions. In both types of dry scrubbers the common concerns are premature clogging of the material matrix by particulate formed upstream, and a limited capacity which requires regular replacement and disposal of the material matrix.

As can be seen, therefore, a number of abatement options are available for the process streams in semiconductor wafer manufacturing. However, the equipment available is generally constructed such that its abatement capabilities are limited to one or two process streams. Industry economics (both cost and space availability) largely dictate that a typical treatment system must simultaneously treat at least four process streams to be feasible. Typical semiconductor wafer manufacturing equipment can simultaneously carry out multiple chemical processing operations. Thus, a single treatment system that is optimized for one or two chemical processes suffers the loss of chemical treatment efficiency and severe maintenance requirements from exposure to the additional chemical process mixtures. Furthermore, because many of the materials requiring treatment are pyrophoric or flammable, serious risk of explosion and fire is associated with poor treatment efficiencies or equipment bypass during unplanned maintenance. Currently, the semiconductor wafer manufacturer is forced to make a compromise in selecting treatment equipment and accept the inherent risk, thus creating a need for a system that is economic, reconfigurable and reliable. The present invention satisfies that need, as well as others, and overcomes deficiencies in current treatment systems.

BRIEF SUMMARY OF THE INVENTION

The present invention comprises a modular point-of-use chemical treatment system employing interchangeable inlet modules which interface to a modular base unit that preferably contains a primary scrubber. In order to optimize individual treatment of specific chemical mixtures and process streams, the inlet modules may be used in combinations, such as by combining high energy reactors, plasma reactors, and scrubbers. The modular system is provided with integrated controls and safety interlocks to permit several different simultaneous unit operations. Reconfiguration of the treatment system, including system expansion, is facilitated through the use of a completely modular subsystem and preferably even the equipment cabinet itself. The modular design of the present invention eliminates the necessity of using an abatement apparatus that is limited to treatment of a particular type of chemical composition or specific process stream.

In accordance with an aspect of the invention, a porous wall thermal reactor which utilizes a thermal process for pyrolizing and oxidizing hazardous materials is provided. A preheated reagent gas is introduced into the thermal reactor through a preferably porous cylindrical reactor wall. Staged mixing of the process gas flowing through the reactor with hot reagent gas causes gas phase reaction of these chemical species, thereby creating new chemical constituents, including gas and particulate matter which are shielded from the reactor wall by the intruding hot reagent gas. These chemical constituents are swept through the reactor and mixed with a cooling gas prior to entering the subsequent scrubbing unit.

In accordance with another aspect of the invention, a falling film plasma reactor which utilizes a high voltage alternating current, or pulsed direct current, is provided. Falling film reactors are typically utilized for reducing metallic oxides, such as $Fe_2O_3$, and $Fe_3O_4$. The electrical current is applied to radially spaced cylindrical electrodes for creating a dielectric breakdown of the process gas flowing within a large radial gap between the two electrodes. Arcing between the electrodes is prevented by passing a dielectric liquid over the electrodes, or a fixed dielectric barrier over which a conductive or dielectric liquid is caused to flow. A reagent gas introduced into the process gas causes electrical energy deposited into the plasma to dissociate atoms and molecules of the gas stream constituents. Subsequent reaction of these chemical species creates new chemical constituents, including gas and particulate matter which contacts the liquid flowing over the electrodes and is absorbed, or reacted, with the liquid and its constituents. The treated process stream is therein swept through the reactor and mixed with a cooling gas prior to entering the subsequent scrubbing unit.

In accordance with another aspect of the invention, universal cooling air sleeves interface the high energy reactors, or basic scrubber inlet, to a liquid spray chamber containing an integral liquid recirculation pump and drain/sump. The liquid spray chamber includes an outlet flanged to accommodate two distinct types of modular scrubbing units. The first type of scrubbing unit comprises an extended height, high efficiency counter-current, packed bed liquid scrubbing tower which interfaces with the liquid recirculation to provide long residence times and high liquid-to-gas ratios. The second type of scrubbing unit comprises both an abbreviated height, moderate efficiency counter-current, packed bed liquid scrubbing tower which interfaces with liquid recirculation, and a fixed bed dry scrubber with in-situ regeneration capability.

In accordance with yet another aspect of the invention, a basic scrubber inlet that eliminates back mixing of downstream gases is provided. In particular, back mixing is reduced for gases which are introduced into the scrubbing unit from separate process inlets that provide staged mixing of the process gas mixture flowing through the inlet nozzle. The first stage can preferably utilize an inert gas sheath which isolates the inlet nozzle from the gas by increasing the inlet throat diameter to reduce gas velocity. The second stage preferably utilizes a high flow air sheath which isolates the exhaust nozzle from the scrubbing liquid droplets and vapor, such that the resultant process gas mixture, additional nitrogen, and clean dry air, are swept into the subsequent scrubbing unit.

In accordance with still another aspect of the invention, interchangeable particulate collectors are incorporated into the exhaust stream of the scrubbing tower to separate liquid and solid particulates from the exhaust gas stream. Two alternative collector embodiments are preferred for separating the particulates from the exhaust gas. An embodiment of the present invention utilizes a collector comprising a series of impactor plates designed to efficiently remove particle diameters ranging from submicron to low micron. The surfaces of the plates are continuously washed with scrubbing liquid to facilitate particle collection. The second embodiment comprises an air powered ejector which accelerates particles at right angles to a collection surface to thereby effect a removal of particles with diameters in the micron range. The air powered ejector simultaneously enhances the exhaust draw on the modular abatement system and depresses the exhaust gas dew point to minimize downstream vapor condensation.

An object of the invention is to provide a chemical abatement system capable of deployment at the point of use.

Another object of the invention is to provide a modular chemical abatement system that supports several treatment regimens.

Another object of the invention is to optimize individual treatment of specific chemical mixtures.

Another object of the invention is to allow for simultaneous operation of several different treatment units.

Another object of the invention is to provide a system that can be rapidly reconfigured, by the replacement of modules, for a variety of process streams.

Another object of the invention is to provide a system with integrated controls and safety interlocks, whereupon changing the type of modular treatment units, the controls may be set for the proper parameters for the new module, such as flow rate, temperature, and pressure, to optimize system performance.

Another object of the invention is to allow for the coupling of high energy reactors with chemical scrubbing units configured for specific chemical mixtures.

Another object of the invention is to provide an abatement system having a thermal reactor which is capable of pyrolizing and oxidizing hazardous materials.

Another object of the invention is to provide an abatement system utilizing a porous wall thermal reactor in which the buildup of particulate is minimized.

Another object of the invention is to provide an abatement system having a thermal reactor having a porous wall configured for easy cleaning.

Another object of the invention is to provide an abatement system having multistage particulate collectors comprising impactor plate designs and air powered ejectors such that a range of particulate sizes are removed.

Another advantage of the invention is to provide for the recovery of useful chemical compositions and elements, such as Gallium, from the scrubber fluid.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Referring more specifically to the drawings, for illustrative purposes the present invention is embodied in the apparatus generally shown in FIG. 1 through FIG. 32. It will be appreciated that the apparatus may vary as to configuration and as to details of the parts, and that the method may vary as to the specific steps and sequence, without departing from the basic concepts as disclosed herein.

In general terms, the invention comprises a modular point-of-use chemical treatment system utilizing interchangeable inlet modules interfaced to a modular base unit, such as a primary scrubber, and preferably capable of supporting additional chemical scrubbing modules. System components are designed and packaged to minimize the time and effort required for installation and maintenance while maximizing lifetime and performance. Integrated controls and safety interlocks permit simultaneous operation of several different unit operations. Rapid reconfiguration of the treatment system, including expansion, is facilitated through the use of fully modular subsystems. The invention can be utilized with various reactor configurations, including the porous wall thermal reactor and falling film plasma reactor described herein.

A process stream from a manufacturing process first enters the modular abatement system, hereafter often referred to simply as the "system", by way of a system inlet module. A variety of system inlet modules may be configured for use within the system for the selective treatment of process streams. The present invention teaches the use of three types of inlet modules: (1) thermal reactors, exemplified as a porous wall thermal reactor (PWTR); (2) plasma reactors, exemplified as a falling film plasma reactor (FFPR); and (3) scrubber inlets, exemplified as a two stage scrubber inlet (TSSI). By way of example, and not of limitation, selective treatment may comprise the use of a porous wall thermal reactor, which might be preferred for treating an aluminum etch process with particulate-forming and chloride compounds; while the falling film plasma reactor might be preferred to treat a silicon nitride etch process with particulate-forming and fluoride compounds. The need to utilize wet chemical scrubbing dictates the selection of the scrubber inlet. For example, a two stage scrubber inlet might be preferred for an epitaxial silicon etch process with high flows of hydrogen chloride.

Figure 1:
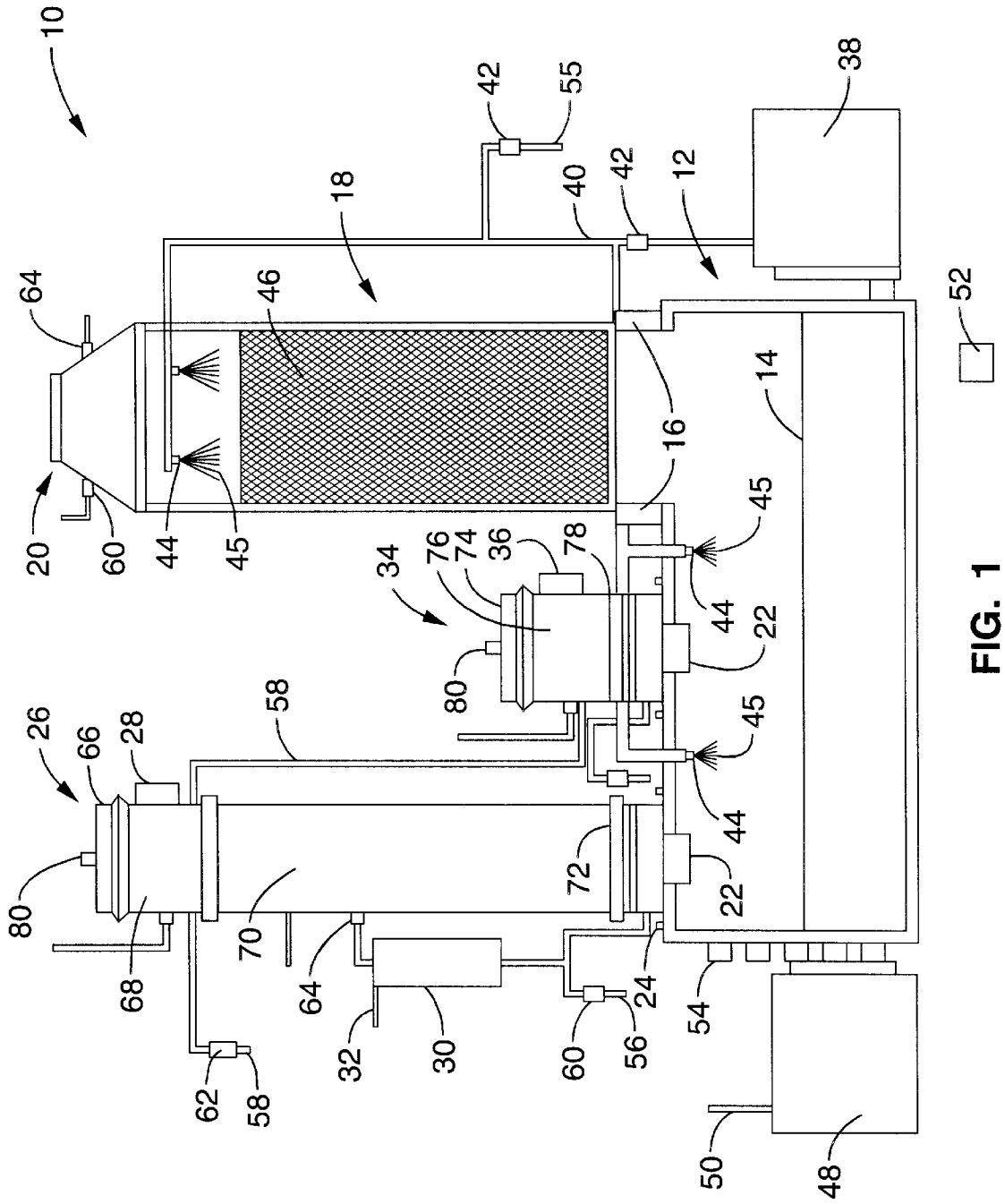
FIG. 1 is a schematic diagram of a modular point-of-use chemical treatment system according to an embodiment of the present invention, shown with interchangeable treatment units.

FIG. 1 shows a two inlet modular abatement system 10 according to the invention having a modular base unit 12, that preferably has a cylindrical cross-section, containing a reservoir of liquid 14. In general application, the modular base 12 is configured as a primary scrubber, and may alternatively be referred to as primary scrubber 12. An upper portion of the primary scrubber 12 is configured with a flanged receptacle 16 for receiving a modular secondary scrubber tower 18 that preferably rises vertically for providing a gravity fed scrubbing process. The scrubber tower 18 is shown providing a wet scrub process, however, it is also capable of supporting dry scrub processes and combinations thereof. An exhaust module 20 is preferably provided above the scrubber tower 18 which substantially determines the rate of process flow through the system. The primary scrubber 12 is configured with a pair of universal cooling sleeves 22, which provide modular receptacles capable of receiving inlet modules whose process exhaust may be cooled therein. The cooling sleeves 22 are attached to the primary scrubber 12 with fasteners 24. A thermal reactor 26, having a process gas input port 28, and a two stage scrubber inlet 34, having a process gas input port 36, are connected to first and second cooling sleeves 22. The thermal reactor 26 contains a core through which the process gas, and preferably a heated source gas, are passed.

The rate at which process gas is drawn into the system through these two inlet modules is substantially determined by the difference in pressure between the process gas source and the modular base unit 12. The exhaust module creates a negative pressure which aids in drawing the process gases through the system.

The system is shown having a pair of liquid scrubbers, specifically, a primary scrubber 12 within the modular base unit, and a secondary scrubber tower 18. Both liquid scrubbers are supplied with liquid from the reservoir 14 by a recirculation pump 38 that directs the liquid through pipes 40, (although tubing, passageways, and so forth, may be used) and a liquid flow sensor 42 to scrubber nozzles 44. The liquid spray 45 from the nozzles 44 within the primary scrubber directs the airborne chemical constituents into the reservoir 14 of liquid while the liquid from the nozzles 44 within the scrubber tower 18 directs the constituents onto a wet scrubber grid 46. A sump pump 48 is fluidly connected to the modular base unit 12 and is capable of pumping out controlled amounts of liquid from the reservoir 14 through a facility drain 50 in response to an excessive fluid level within the reservoir of the base unit. A leakage sensor 52 is provided (preferably within a cabinet or retention pan) for detecting the presence of liquid which has escaped the system. The fluid level within the reservoir is registered by fluid level sensors 54. A modular reagent addition system may be provided to control pH and to enhance process chemical scrubbing within the present system. Fresh water, or alternatively fluids, may be added to the system at any time, as represented by the fresh water inlet 55 having a regulated input and capable of being monitored by another liquid flow sensor 42.

An assortment of sensors along with liquid and gas plumbing are shown interconnecting the elements of the system. Specifically, a line from an air source 56, and a line from an inert gas source 58 are shown. Various aspects of the abatement process are monitored so that treatment may proceed quickly and efficiently. Specifically, gas/air pressure sensors 60 are capable of registering back pressure, such as occurs when a thermal reactor becomes increasingly clogged. Flow sensors 62 provide for monitoring the flow of gas/air through the system. Temperature sensors 64 allow the control system to monitor static temperatures and trends in temperature which may be indicative of specific conditions.

The thermal reactor 26 is configured to facilitate quick replacement and core changeovers, and is constructed with a top flange 66 attached upon an upper assembly 68 which is mounted to an elongated lower assembly 70 whose lower end 72 is configured for attachment to the modular base 12 (primary scrubber) by way of universal air cooling sleeve 22. The two stage inlet 34 is configured in a similar modular construction, with a top flange 74 attached to body assembly 76 whose lower end 78 is configured for attachment to the primary scrubber 12 through a universal air cooling sleeve 22. The top flanges of the thermal reactor 26 and the two-stage scrubber inlet 34 are configured with a universal port 80, that allows for the connection of an assortment of devices and sensors.

Figure 2:
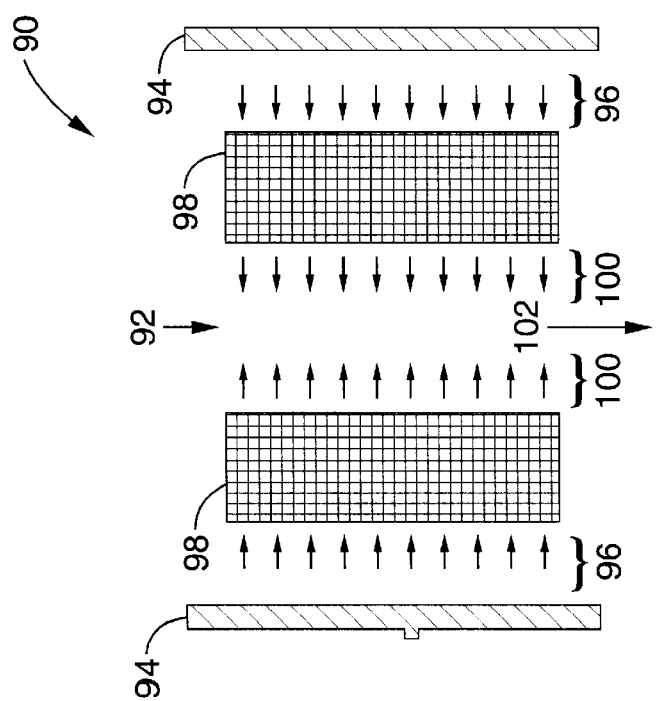
FIG. 2 is a schematic diagram of porous thermal wall reactor operation according to an aspect of the present invention.

FIG. 2 shows a schematic for a thermal reactor 90 which utilizes a thermal process to pyrolize and oxidize hazardous materials. The chemical process mixture 92 flows into the reactor where it is directed by means of a nitrogen sleeve nozzle into a reaction chamber having housing walls 94. Preferably the reaction chamber comprises the internal volume substantially of a cylindrical housing within which a reaction core is retained. A preheated reagent gas 96 is introduced into the reactor through the porous wall 98 to mix with the process stream 92. The hot reagent gas causes reaction of these chemical species, thereby creating new chemical constituents including gas and particulate matter. The process stream constituents are shielded from the reactor wall by the intruding hot reagent gas 96. Thus, these chemical constituents 102 are swept through the reactor and mixed with a cooling gas prior to entering the subsequent scrubbing unit.

Figure 3B:
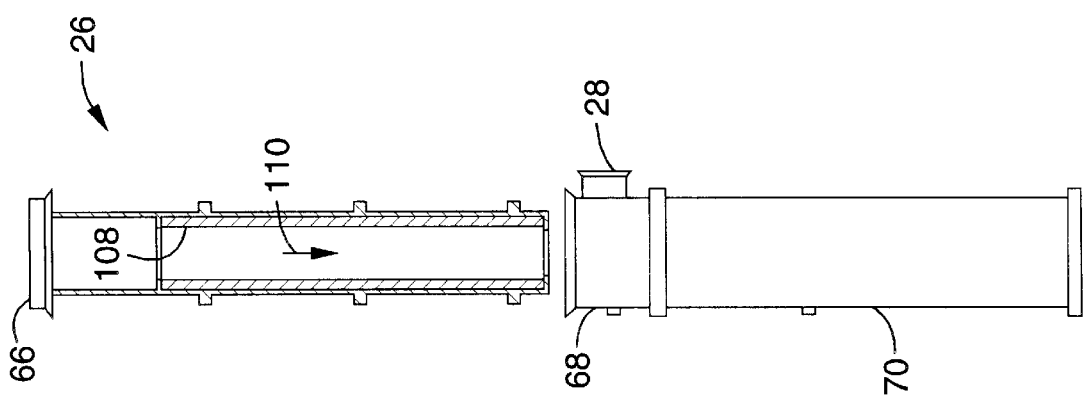
FIG. 3B is a side schematic view of the thermal reactor shown in FIG. 3A in which the core has been removed to allow for replacement or maintenance.
Figure 3A:
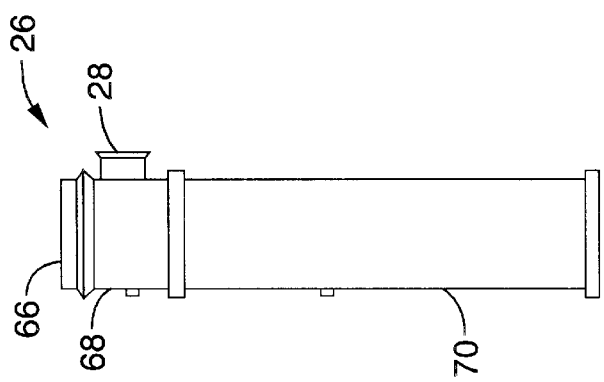
FIG. 3A is a side schematic view of a thermal reactor according to an aspect of the present invention, which is shown prior to disassembly.

In FIG. 3A the thermal reactor 26 is shown assembled and in FIG. 3B the thermal reactor 26 is shown upon disengaging the flange 66 and removal of the core assembly 106 within which is retained a porous wall core 108. Should the porous wall core 108 need replacement, the top flange 66 can be easily disconnected, thereby, allowing all components which contact the process stream to be removed as an integral assembly. Once the porous wall core 108 is replaced, the new core assembly 106 is lowered into the reactor housing and after the top flange 66 is reconnected, the reactor may be restarted. The complete maintenance can be performed without disconnecting the individual chemical process lines and while the additional inlet modules continue substantially normal operation. A reactor may be replaced with one having the same set of reaction attributes, or one that provides a different set of attributes, so as to alter the reaction process used. It will further be appreciated that the reactor design, as shown in FIG. 3B, integrates a cleaning mechanism which can be used to clear the straight-through path of the process flow without the need of equipment shutdown. The cylindrical interior of the porous wall core 108 can be cleared by the insertion of a plunger having a cleaning head adapted to the inner diameter of the porous wall core.

Figure 4:
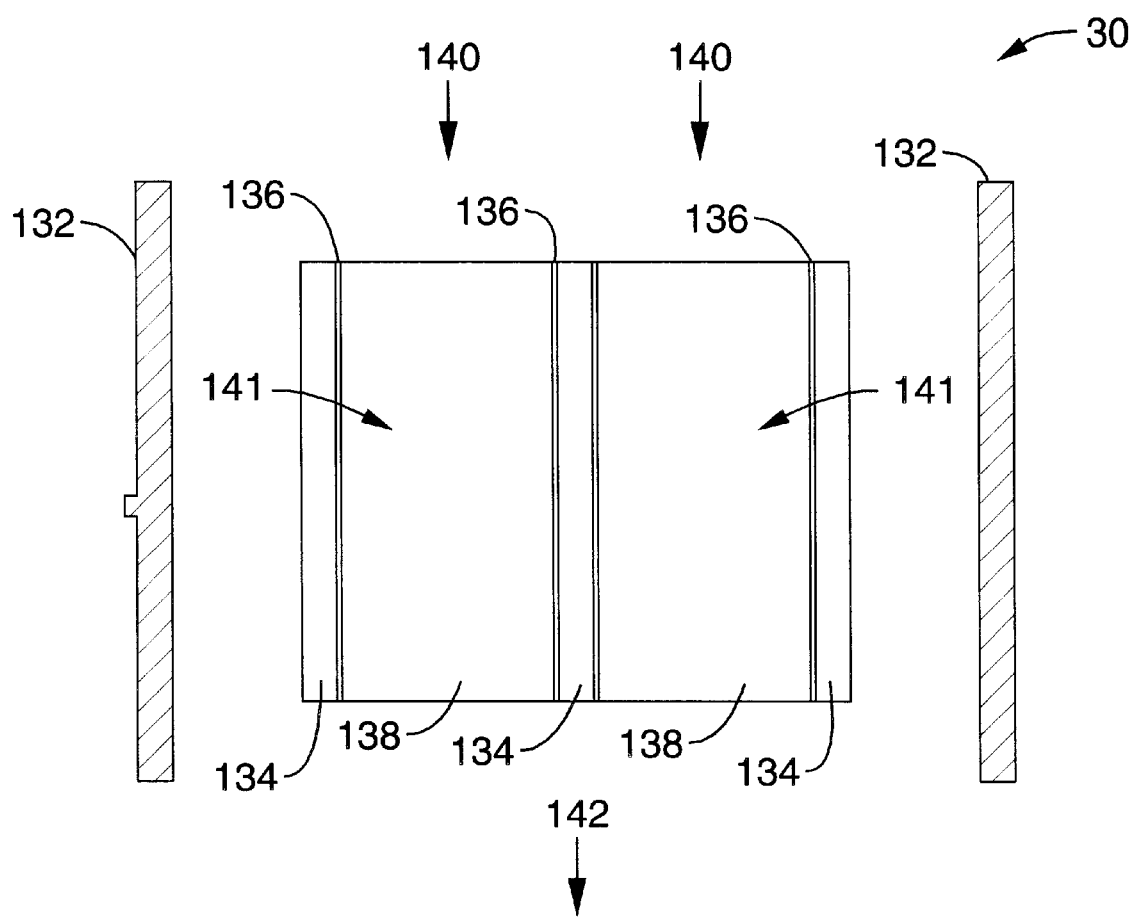
FIG. 4 is a schematic diagram of a falling film plasma reactor according to an aspect of the present invention shown with an inner electrode assembly, outer electrode assembly, and a reactor housing.

FIG. 4, represents a falling film plasma reactor chamber between the walls 132 of a housing, wherein the plasma reactor uses high voltage alternating current or pulsed direct current applied to spaced electrodes 134 covered with a dielectric material 136 so as to create dielectric breakdown of the process gas within the large radial gap 138. Preferably, the opposing electrodes are implemented as concentric cylinders between which annular space is provided through which the process gas is passed. Use of conventional electrodes, covered with solid dielectric, are susceptible to failure due to arcing when any portion of the solid dielectric is compromised. The breakdown of the dielectric covering the electrode, and the associated arcing, is preferably prevented within the present invention by utilizing a liquid dielectric 136 flowing over the electrodes to prevent dielectric breakdown. The electrodes may, in addition, be coated with a fixed dielectric barrier over which the liquid dielectric 136 is directed. The process gas mixture flows through the annulus created by the combination of electrodes and dielectric materials and is sufficiently ionized therein to create general dielectric breakdown of the gas. A reagent gas 141 is introduced into the process gas 140 within the plasma zone 138. The electrical energy deposited into the plasma dissociates atoms and molecules of the gas stream which generates constituents comprising energetic electrons and reactive chemical species. Subsequent reaction of these chemical species with the reagents creates new chemical constituents including gas and particulate matter which in the course of flowing through the reactor contacts the liquid flowing over the electrodes. Consequently, constituents of the chemical process stream are absorbed or reacted with the liquid and its constituents. Thus, the liquid simultaneously removes undesirable chemical constituents from the process stream and cools the process stream and reactor. The liquid is collected in a plasma reactor fluid reservoir and pumped through a filtration system (separate from the fluid recirculation system of the primary scrubber) to remove the undesirable chemical constituents and excess heat prior to recirculating the liquid to the plasma reactor. The treated process stream 142 is swept through the reactor and mixed with a cooling gas prior to entering the subsequent scrubbing unit.

The liquid reservoir, pump, and filtration system of the plasma reactor are modular and accessible to facilitate maintenance or replacement. The complete maintenance described can be performed without disconnecting the individual chemical process line and while the other reactors continue normal operations. With the basic scrubber inlet, the chemical process flow is redirected by means of a nitrogen sleeve nozzle into the universal cooling air sleeve. Subsequently, the process stream is mixed with the cooling gas prior to entering the following scrubbing unit. The inlet design integrates a cleaning mechanism which can be used to clear the straight-through path of the process flow without any equipment shutdown.

Referring again to FIG. 1, it will be appreciated that the scrubber tower 18 can accommodate various distinct scrubbing modules. A first scrubbing arrangement is shown in FIG. 1 as a single extended height, high efficiency counter-current secondary wet scrubber with a packed bed grid 46 which interfaces with the liquid recirculation system to provide long residence times and high liquid-to-gas ratios. Numerous scrubber modules may be arranged individually or in combination. As an example of a second scrubbing arrangement (not shown), a pair of scrubber modules are incorporated into the scrubber tower 18. By way of example, a lower scrubber module provides an abbreviated height, moderate efficiency counter-current, packed bed liquid scrubber which also interfaces with the liquid recirculation system, while an upper scrubber module provides a fixed bed dry scrubber with in-situ regeneration capability. The configuration of the dry scrubber should preferably extend the utility of the dry scrubber by lowering the probability of particulate clogging and by reducing the concentrations of process stream constituents to be removed by the dry scrubber. The dry scrubber preferably comprises multiple fixed beds of support material coated with reagent. Integral to each bed are means for heating, gas flow, and liquid spray. Upon saturation of each bed, an alternate bed is selected to treat the process stream. The saturated bed is then recoated with reagent and heated to promote drying and reagent activation. The modular regeneration system includes a reagent reservoir (not shown) and reagent pump (not shown).

The components of the present invention are preferably housed in a cabinet (not shown) that facilitates custom configuration and expansion of the modular point-of-use chemical treatment system. A simple fastening system using only two types of fastening components with bolts is used to assemble the tubular aluminum cabinet frame and provide component mounting fixtures. The fastening system permits expansion of the cabinet without modification or disassembly of the existing structure. Feasibility of the expansion process results from the on-site assembly of components which are manageable both in size and weight.

The modular abatement system of the present invention may be implemented in various ways to support numerous and varied chemical process streams. It will be appreciated that the inlet modules utilized within the system may be configured in a number of ways without departing from the teachings of the invention.

Figure 5:
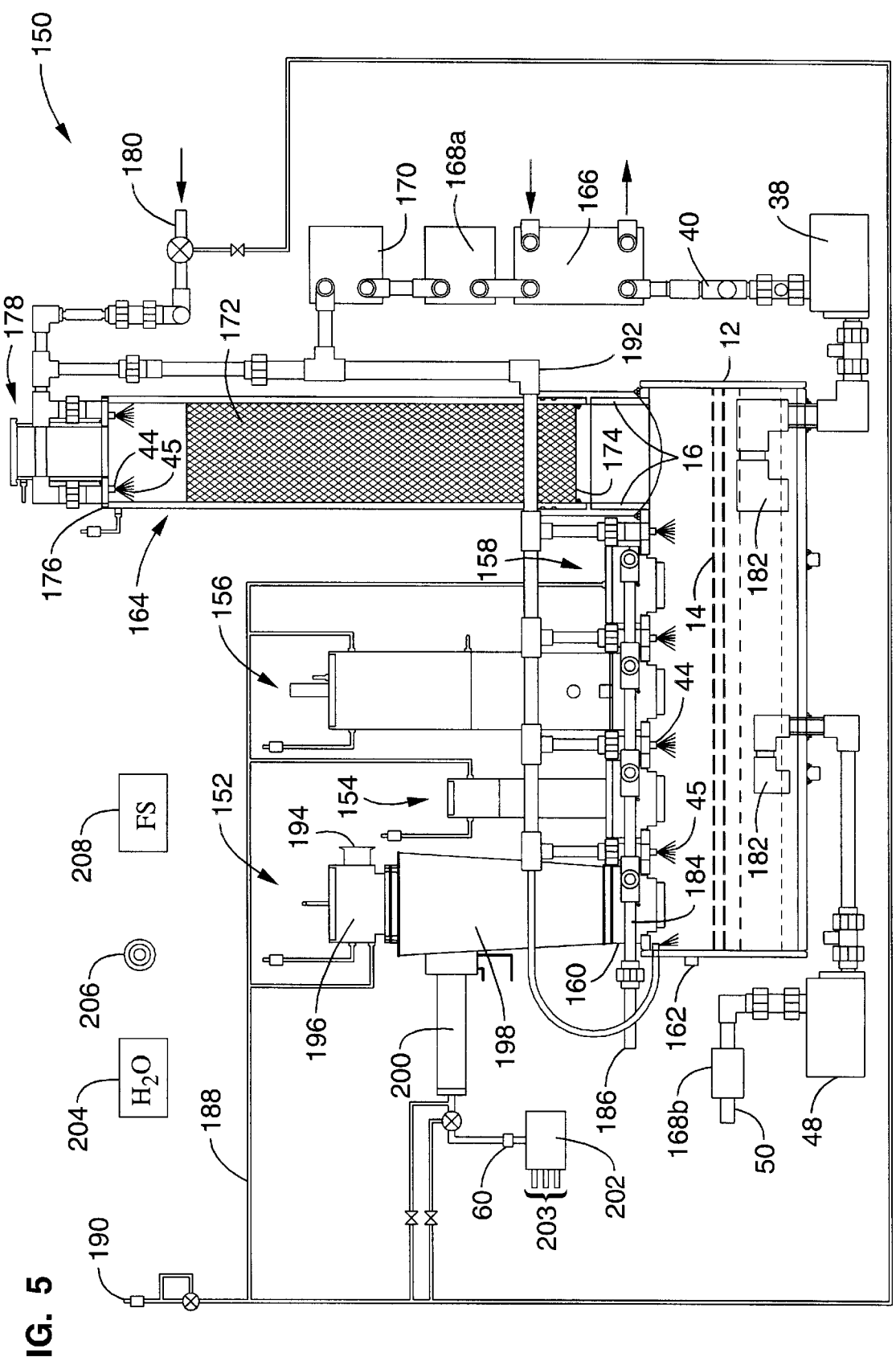
FIG. 5 is a side schematic view of the modular chemical abatement system according to an embodiment of the present invention showing a cutaway of the primary and secondary scrubber units.

FIG. 5 shows a modular abatement system 150 according to another embodiment according to the present invention which comprises a modular point-of-use chemical treatment system having interchangeable inlet modules which are connected into a common modular base unit which preferably comprises a primary scrubber unit 12. The primary scrubber 12 contains four process stream inlets into which are shown connected a porous wall thermal reactor 152, a two stage scrubber inlet 154, a falling film plasma reactor 156, along with an unused inlet 158 which is capped and purged with nitrogen.

The inlet modules utilized may provide any of numerous chemical treatments for the process flow. These inlet modules may comprise any combination of thermal reactors, plasma reactors, particle collectors, scrubbers, and so forth. The inlet modules are configured for modular attachment to a modular base unit which preferably contains a chemical scrubbing unit which is configured for modular attachment of a secondary scrubber, and interchangeable particulate collectors, the combination optimized for the treatment of specific chemical mixtures. Every component of the system is designed and packaged to minimize the time and effort required for installation and maintenance and to maximize lifetime and performance. Integrated controls and safety interlocks are preferably utilized within the system to permit simultaneous operation of several different inlet modules. The entire system, including controls and cabinets, are preferably configured to provide for rapid reconfiguration, or expansion, of the treatment system.

Several universal cooling air sleeves 160 in FIG. 5 have been received within inlet holes along the top surface of the primary scrubber 12, which is often called a liquid spray chamber. The universal air cooling sleeves 160 provide a coupling that is capable of receiving any inlet module and cooling its associated process stream. The universal air cooling sleeve 160 of each inlet module is shown connected to a cooling air supply line 184 that connects to a supply 186 of pressurized cooling air.

Within the primary scrubber 12 are located several liquid spray nozzles 44 for creating a liquid spray 45. The liquid spray chamber functions as the primary (wet) scrubber 12, the recirculation reservoir, and the sump tank. By integrating these functions, the requirement for using liquid isolation traps (commonly P-traps) is eliminated and thereby the need for frequent maintenance associated with their use. The cylindrical shape of the chamber eliminates corners responsible for flow stagnation and sedimentation. The chamber volume is small by design to vigorously agitate the recirculation liquid. This agitation suspends the scrubbed solids within the scrubbing liquid to promote extraction by the sump.

The individual, pretreated process streams are introduced into the primary scrubber through the inlet modules which are coupled to the universal cooling air sleeves 160. As the process streams traverse the spray chamber above reservoir 14, soluble and reactive vapors as well as particulate are removed by the wet scrubbing process. The liquid spray nozzles 44 are configured to create a spray 45, as curtains through which the individual and combined process streams must pass before mixing within the liquid of the reservoir 14 and then entering the secondary scrubber in the scrubbing tower 164. The liquid spray nozzles 44 are supplied with liquid from the reservoir 14 recirculated by pump 38 through a fluid supply line 192. The liquid spray 45 washes the chamber walls and cools the combined process streams prior to entering the secondary scrubber. This spray configuration ensures that the individual process streams are relatively cool and prescrubbed prior to mixing with adjacent process streams. A variety of gaseous and particulate chemicals become concentrated in the recirculated liquid of the reservoir 14. Upon mixing with the other pretreated process streams, the combined process stream is swept, by recirculation, into the secondary scrubber within the scrubbing tower 164.

Integral liquid recirculation is provided with a recirculation pump 38 that receives fluid through a fluid pickup 182 which is coupled to fluid carrying pipes 40 (or tubing, hoses etc.). The recirculating liquid is preferably passed through a heat exchanger 166 so that the temperature of the liquid may be controlled, typically by sufficiently cooling the liquid.

The recirculation system also contains a resource recovery module 168a, with an additional resource recovery module 168b contained prior to the sump drain 50.

The recovery module 168a in the recirculation system provides incremental recovery of various constituents for either reuse, or disposal, as the liquid repeatedly cycles through the system. Another recovery module 168b is placed in line with the sump drain so as to provide recovery when draining liquid from the primary scrubber 12.

Additionally, a reagent system 170 preferably dispenses reagents into the scrubbing liquid to promote additional reaction chemistries and improve the solubility of materials scrubbed from the process stream. The reagent system comprises a reagent reservoir, reagent pump, and sensor-based controls which enhance the scrubbers. Many of these reagent chemicals can be recovered prior to sumping the liquid to a facility drain. Recovery of the reagent, which is used to improve scrubber performance, can significantly reduce the cost of operating the system as well as minimize the risks associated with transporting and refilling the reagent supply. Certain chemicals used in the production processes also have intrinsic value. Compounds in the chemical categories of Groups III, IV, and V metals and nonmetals can be valuable as a reclaimed material. The use of several technologies utilizing electrochemistry, reaction chemistry, and separation techniques enable the module to selectively recover compounds for immediate reuse or reprocessing. By way of further example, scrubbing efficiency of process streams containing acid gases can be greatly increased by adding a reagent such as potassium hydroxide, which reacts with the acid gas to form a salt which is soluble and easily extracted by the sump. However, the recovery of this reagent can be accomplished using electrochemical technology with subsequent reuse by the wet scrubber.

Control of the liquid in the reservoir 14 is provided with a sump pump 48 that intakes fluid from the reservoir through an inlet 182 and transfers it to a drain 50. Sensors monitor the liquid flow and liquid levels to regulate the operation of the recirculation-sump functions. A maintenance access port 162 is preferably provided on the primary scrubber. The primary scrubber 12 is preferably configured with an outlet flange to provide for the connection of additional primary scrubber sections to increase the length of the primary scrubber and for receiving additional inlet modules.

The scrubbing tower 164 can be configured for secondary scrubbing with one or more distinct scrubbing modules. One embodiment of secondary scrubber comprises a single extended height, high efficiency counter-current, packed bed liquid scrubbing tower which interfaces with the liquid recirculation system to provide long residence times and high liquid-to-gas ratios. The scrubbing tower comprises several feet of high performance packing material 172, one or more perforated plates 174 to support the packing, several spray nozzles 44 to distribute 45 liquid over the surface of the packing 172, a lower flange 16 to connect the tower to the primary scrubber 12, and a top plate 176 to manifold the spray nozzles and mount the scrubber exhaust module 178. Treated streams pass through the exhaust module 178 which can provide for additional treatment, such as removing particulates while the exhaust system can be utilized to control process gas flow rate.

The inlet modules 152, 154, and 156 in FIG. 5 can be modularly connected into the abatement system 150 in accord with the needs of the process streams being treated. Each of the inlet modules is supplied with inert gas through gas lines 188 from a connection 190 to an inert gas supply.

The thermal reactor 152 inlet module receives process gas through a process gas intake port 194 within the inlet head 196 which is attached on the body 198 of thermal reactor 152. A gas heater 200 provides for heating of the reagent gases as they enter the thermal reactor 152. The reagent gases may be supplied from a gas reagent system 202 that controls the delivery of various reagents 203. The output of the gas reagent system 202 is preferably manipulated by the control electronics of the system.

The modular abatement system 150 has been developed to allow for safe and efficient gas processing. To enhance safety, a series of additional sensors are preferably utilized comprising a leak sensor 204 which senses any liquid accumulation from system leaks, a smoke detector 206, and an exhaust gas flow sensor 208 to assure that the process gases are being processed. It will be appreciated that the present abatement system is preferably mounted within a cabinet to further insure safety, however, it may be free-standing.

The treated process streams exit the system through the exhaust module 178. Preferably the exhaust module 178 provides additional particulate removal, demisting, and dew point depression, while increasing exhaust draw. The preferred embodiment utilizes an exhaust module 178 that is supplied with air through a connection 180 to a regulated air supply, and includes ports for pressure and temperature monitoring. Two distinct methods of particle separation are exemplified within the embodiment.

Figure 6:
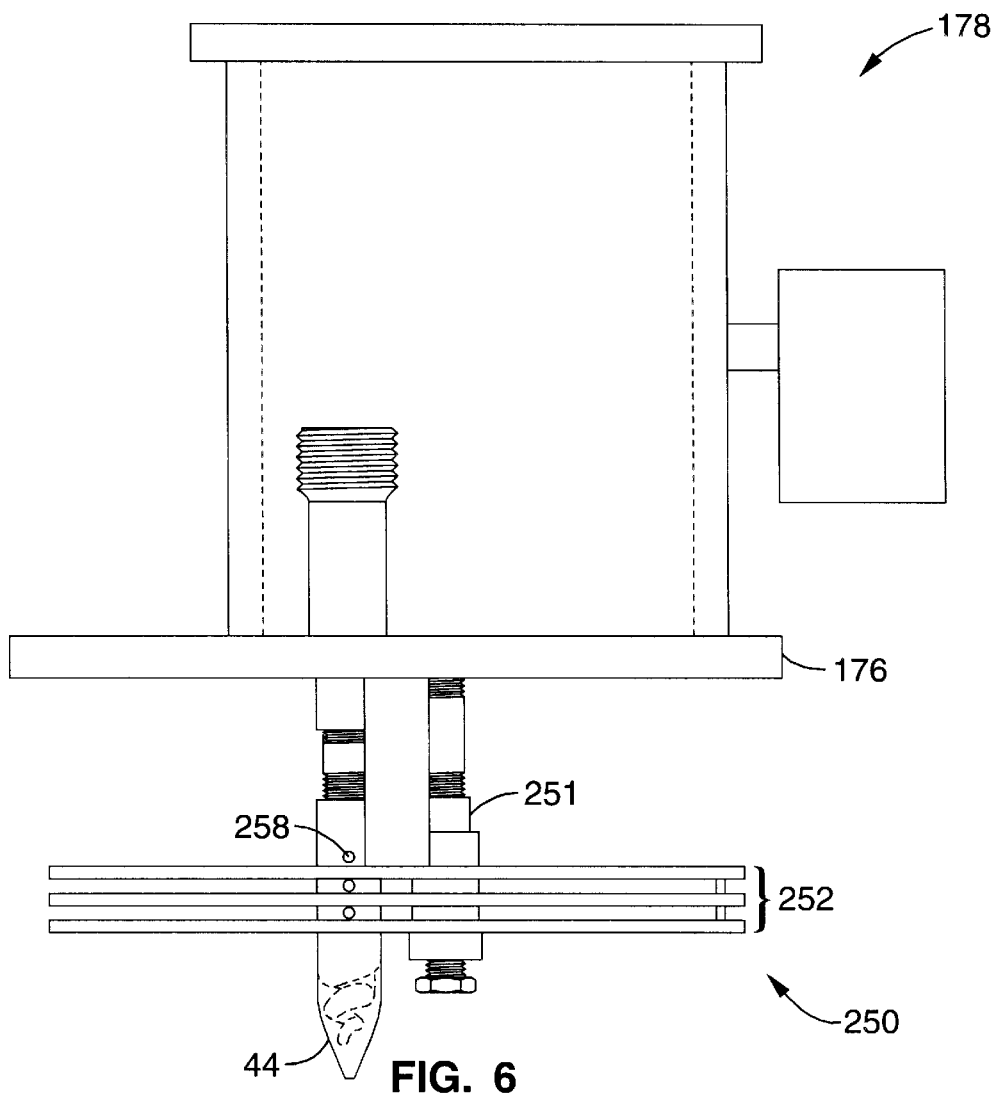
FIG. 6 is a side schematic view of a particulate collector according to an aspect of the present invention showing a series of removable impactor plates.
Figure 7:
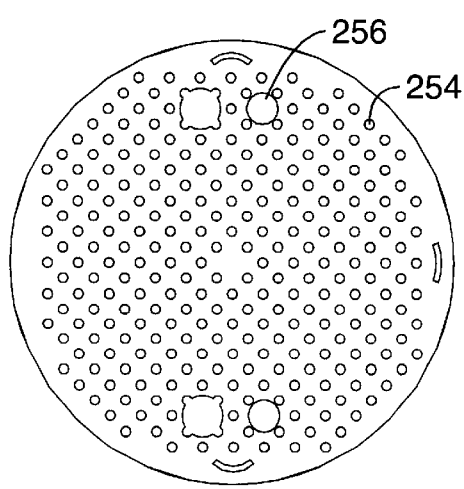
FIG. 7 is a top view of an impactor plate as shown in FIG. 6 for attachment within the particulate collector.

Upon entering the first section of the exhaust module 178, the process stream encounters a series of liquid-washed impactor plates which are configured for the nominal collection of particles within a given particle size range. Residual particulate from previous treatment operations as well as mist created by the spray nozzles is impacted onto the plates and removed. FIG. 6 shows a first particle collector assembly attached to the top plate 176 of the scrubbing tower, and comprises a mounting assembly 251 which retains a series of impactor plates 252 designed to efficiently remove particle diameters ranging from submicron to low micron. An impactor plate 252 is shown in FIG. 7 having a series of flow apertures 254 and mounting holes 256. The surfaces of the plates used for particle collection are continuously washed with scrubbing liquid from apertures 258 within the tubing of the spray nozzle 44 to minimize the accumulation of solids.

Figure 8:
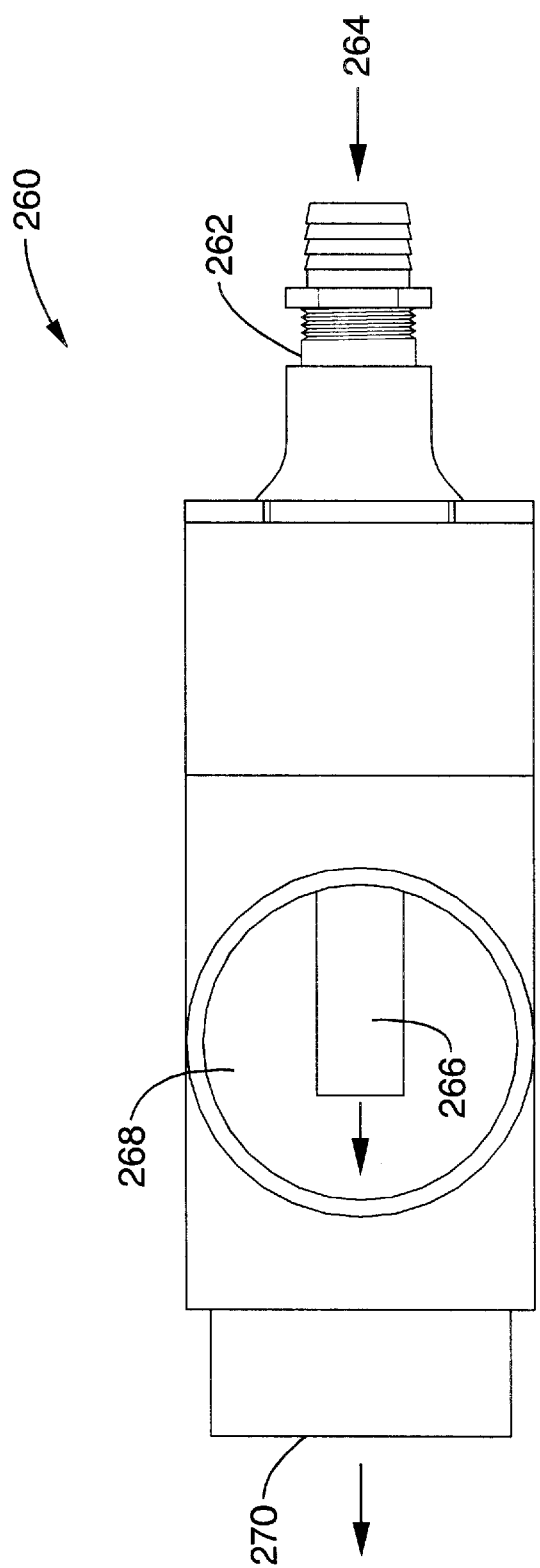
FIG. 8 is a side schematic view of an air powered ejector according to an aspect of the present invention.

A second collector 260 is shown in FIG. 8 which comprises an air powered ejector that accelerates particles at right angles to a collection surface effecting removal of micron diameter particles. An air input line 262 receives air at a predetermined pressure at a proximal end 264, which exits the input line 262 at a distal end 266. Process gas is evacuated from the scrubber tower into the collection manifold 268 and output through an exhaust port 270, which may alternatively be plumbed to additional equipment or locations. As the high speed air travels through the ejector 260, it creates a vacuum draw as a result of venturi effect so as to draw up gases from the top of the scrubber tower into the collection manifold 268. The ejector, therefore, provides for both particulate reduction and enhanced exhaust draw on the modular abatement system. Regulating the flow rate of the incoming air into 264 can provide for regulation of exhaust draw. Additionally, the ejector 260 lowers the exhaust gas dew point temperature to minimize downstream vapor condensation. Thus, the combined process stream exits the modular chemical abatement system as a relatively clean and dry mixture of gases which presents no immediate hazards to the personnel or the production facility.

Figure 10:
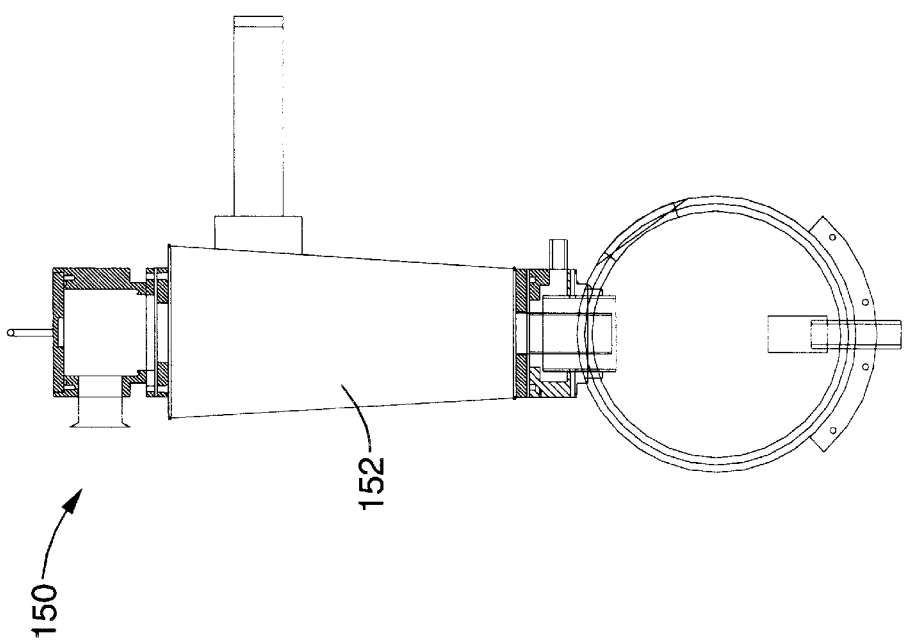
FIG. 10 is an left end schematic view of the modular abatement system of FIG. 9 which shows the pneumatic and hydraulic connection of a thermal reactor.
Figure 9:
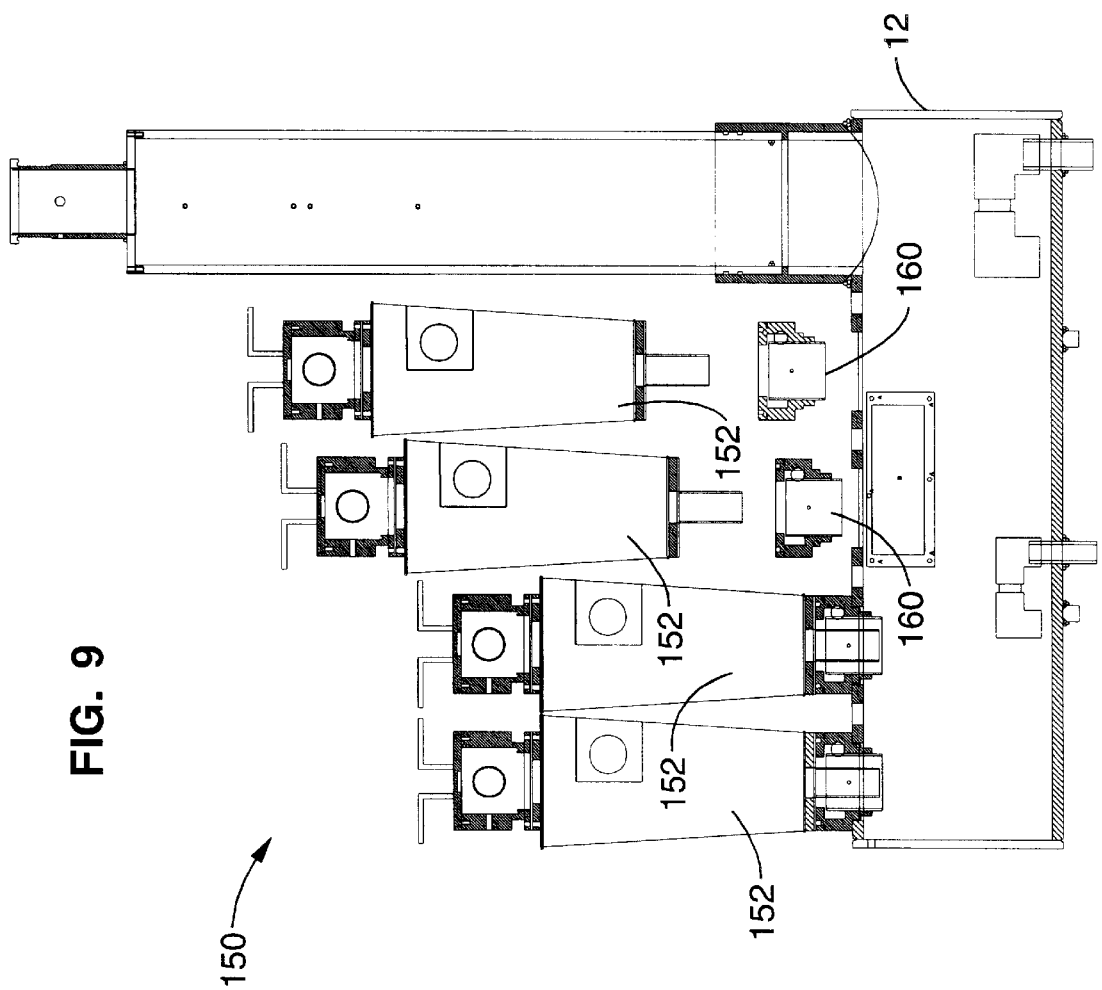
FIG. 9 is a partial side schematic view of a modular abatement system according to the present invention shown configured with four thermal reactors, two of which are shown, along with an associated universal air cooling sleeve, prior to installation.

The modular abatement system 150 is shown in FIG. 9 being fitted with four thermal reactors 152. A pair of universal cooling air sleeves 160 are shown separated from the primary scrubber 12 to aid in understanding the mounting relationships. However, it should be recognized that the universal cooling air sleeves 160, are generally to remain attached to the scrubber 12 when receiving any of a number of inlet modules. FIG. 10 is a side view of the abatement system 150 which shows the cylindrical reservoir 14 and the orientation of the various fluid communication pipes orthogonal to the length of the primary scrubber unit 12 to facilitate the attachment of a series of plumbing connections which may be rapidly attached or disengaged.

Figure 11:
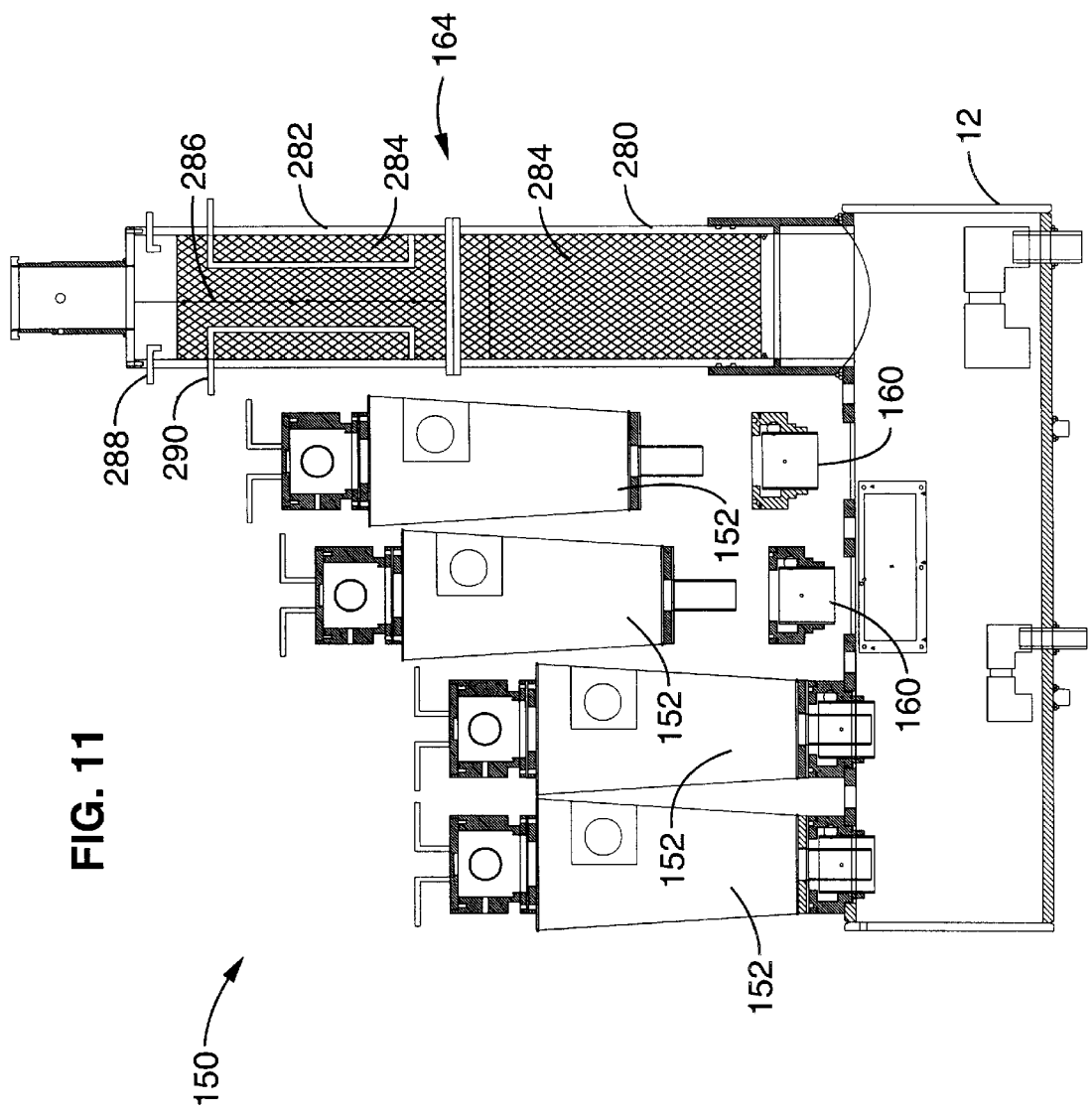
FIG. 11 is a side schematic view of an alternative embodiment of the modular abatement system of FIG. 9 in which the secondary scrubber has been replaced with a two phase scrubber utilizing a dry scrubber first stage and a wet scrubber second stage.

An embodiment of the modular abatement system 150 is shown in FIG. 11 having an alternative arrangement of two scrubbers 282, 284 that form the scrubbing tower 164. The lower scrubber 280 is an abbreviated height, moderate efficiency counter-current, packed bed liquid scrubbing tower. This short scrubber provides the same features as the extended height tower yet has lower performance as a result of the smaller amount of packing material 284 used. The upper scrubbing module 282 comprises a fixed bed dry scrubber with in-situ regeneration capability. The fixed bed dry scrubber comprises multiple chambers divided by walls 286 which contain high surface area solid packing material. Each chamber is provided with a spray nozzle 288 for spraying liquid reagent onto the packing material and a heater 290 for heating the packing material. As the combined process stream is continuously scrubbed, the capacity of the dry scrubber bed is reached and the combined process stream is then redirected into an alternate dry scrubber bed while the initial dry scrubber bed is being regenerated. A regeneration system (not shown) comprising a reagent reservoir, a reagent pump, and sensor-based control periodically replaces the reagent coating on the surfaces of the solid packing material. Upon recoating, the solid packing material is heated to dry and activate the reagent coating.

Figures 12, 13:
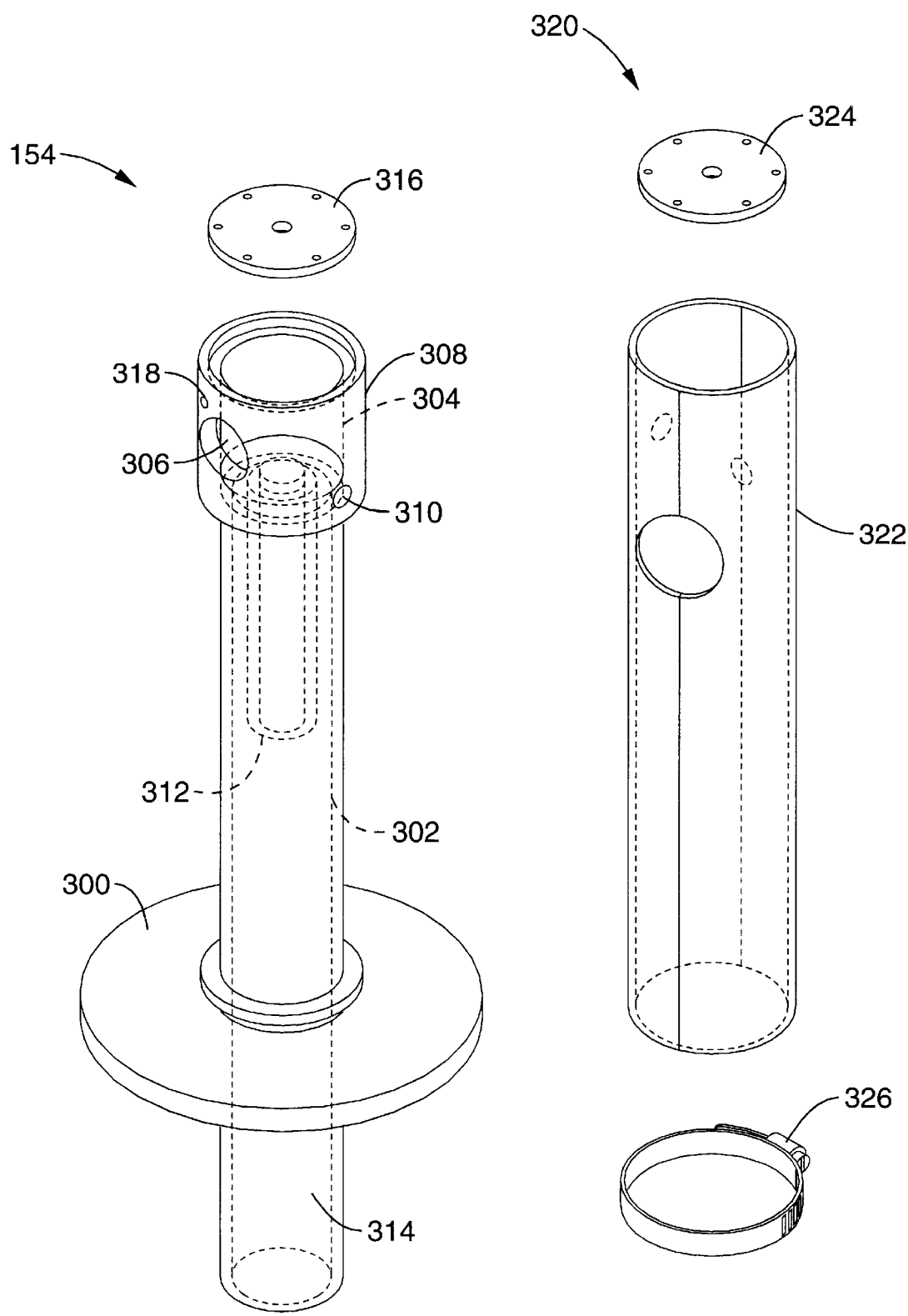
FIG. 12 is a perspective partial exploded view of a scrubber inlet assembly according to an aspect of the present invention.
FIG. 13 is a perspective partial exploded view of a housing for use with the scrubber inlet assembly of FIG. 12.

One of the inlet modules for use with the modular abatement system is the scrubber inlet module 154 of FIG. 12. This inlet module is mounted to the universal cooling air sleeve (not shown) by way of a flange 300 that attaches to a cylindrical inlet chamber 302. This inlet 154 for the primary scrubber 12 utilizes two mixing stages that eliminate back mixing of downstream gases, in particular those which were introduced into the scrubbing unit from separate process inlets. The first mixing stage is accomplished by an inert gas sheath 304 which isolates the inlet nozzle 306 within the inlet head 308 from the second stage. Inert gas enters from an inert gas inlet 310 and mixes with the process stream within the increased diameter past the inlet throat 312 thereby reducing gas velocity. The second stage is accomplished by the inlet exhaust nozzle 314 extending into the universal cooling air sleeve (not shown). The inlet module 154 integrates a cleaning mechanism which can be used to clear the straight-through path of the process stream without any equipment shutdown. The inlet top plate 316 may be removed from the inlet head 308 to facilitate periodic inspection and cleaning and also provides a universal access port for monitoring process stream pressure. Thus, the back pressures on all process lines are individually and simultaneously monitored. The complete maintenance, as described, can be performed without disconnecting the individual chemical process lines, and without disrupting the normal operations of the other inlet modules. A scrubber inlet housing 320 is depicted in FIG. 13 comprising an enclosure 322, a top cap 324, and an attachment clamp 326. The scrubber inlet housing 320 protects and insulates the scrubber inlet 300.

Figure 14:
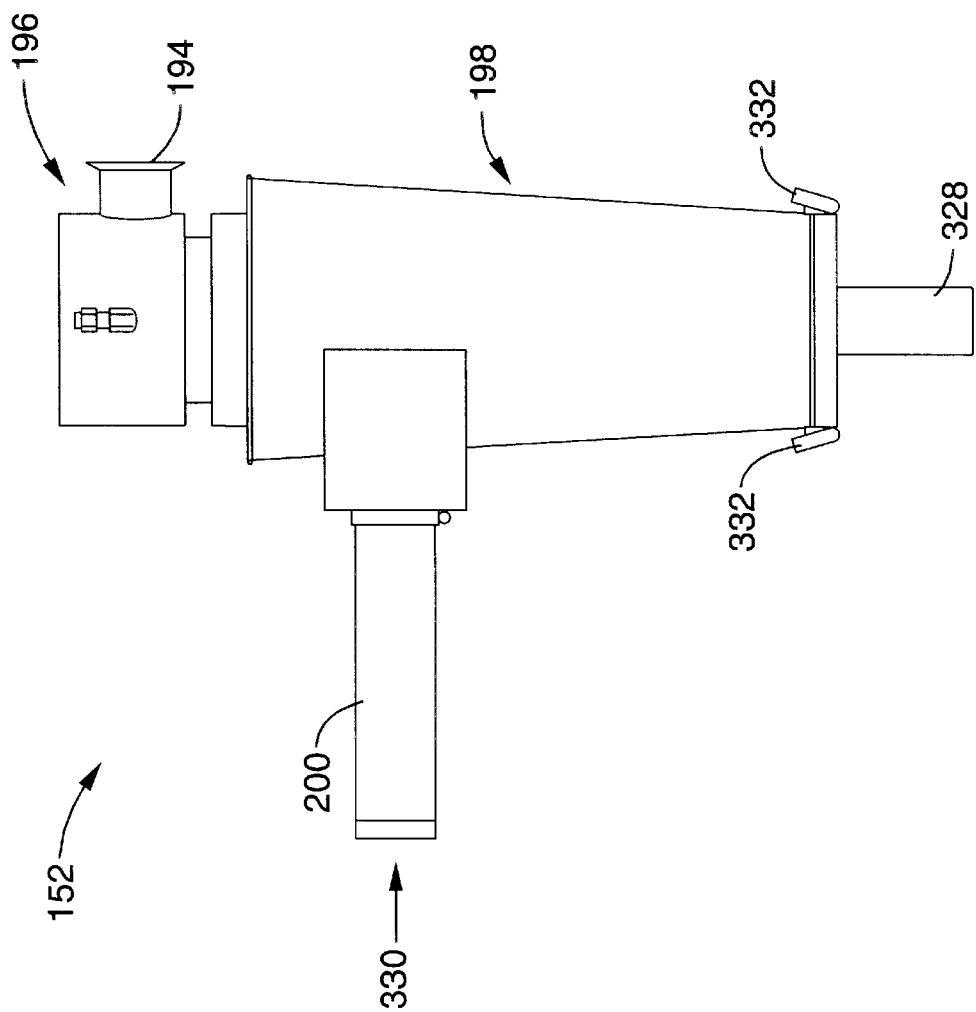
FIG. 14 is a side view of a modular porous wall thermal reactor according to an aspect of the present invention.
Figure 15:
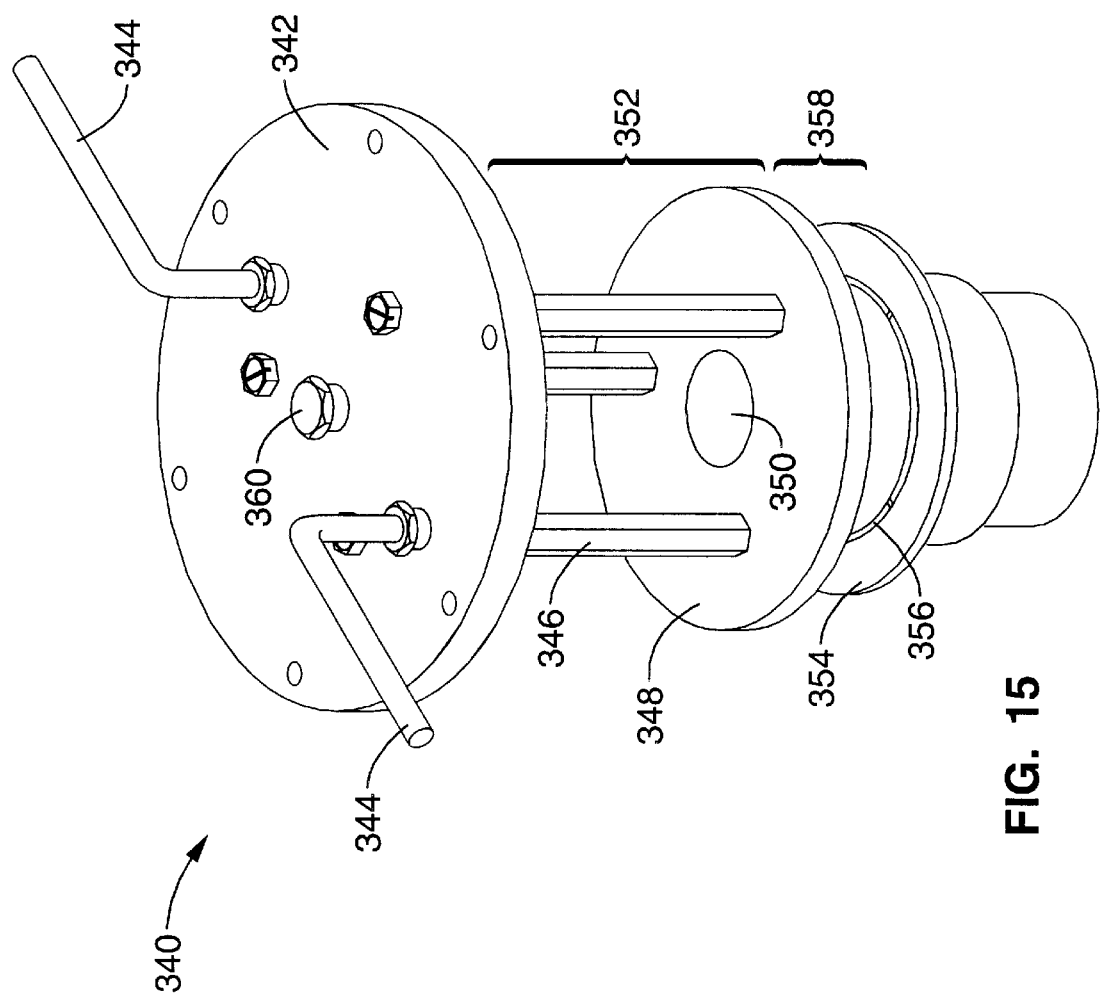
FIG. 15 is a perspective view of a sleeve nozzle for use within the porous wall thermal reactor shown in FIG. 14, showing the inlet areas for source gas and inert gas.

A porous wall thermal reactor 152 is shown in FIG. 14 which by way of a thermal process pyrolizes and oxidizes hazardous materials passed through it from the process stream. The thermal reactor 152 comprises an process gas inlet port 194 within the inlet head 196 that is attached to a housing 198. The process gas is exhausted from an exhaust nozzle 328. The thermal reactor has a gas input connection 330 which is connected to a gas heater 200 for preheating the gas as it enters the thermal reactor 152 so as to increase reaction levels. Modular fasteners 332 are provided on the lower portion of the housing 198 for retaining a thermal reactor to the universal cooling air sleeve. These modular fasteners 332 preferably comprise a quick-release mechanism that may be manually operated so that replacement of the inlet module may be quickly performed. Annularly disposed within the inlet head 196 of the thermal reactor 152 is a sleeve nozzle 340 which is shown in FIG. 15. When inserted within the inlet head 196 of the thermal reactor as shown in FIG. 14, the top plate 342 (FIG. 15) forms the top of the inlet head. Referring again to FIG. 15, handles 344 are provided on the top plate 342 so that an assembled thermal reactor may be manipulated for attachment or removal from the system. Standoffs 346 attached to the top plate 342 connect to a process gas receiving flange 348 that has a central process gas passageway 350. When installed within the inlet head (196 of FIG. 14) the area of the standoffs 346 provides a process gas receipt chamber 352 which is in fluid communication with a process gas passageway 350. An inert gas receiving flange 354 is attached below the process gas flange with a passageway 356 which is annularly disposed on the passageway 350. A chamber 358 receives inert gas from a coupling on the inlet head and the inert gas is passed through passageway 356, annularly disposed about and separated from passageway 350, such that the process gas and the inert gas do not mix within the sleeve nozzle 340. The nitrogen (or alternative inert gas) used for the sleeve flow may also be premixed with reagent gas(es). A universal connector port 360 in the top plate 352 of the sleeve nozzle 340 allows for the attachment of various equipment, such as injectors, and igniters. For example, an injector can be inserted through the universal connector port 360 to premix reagent gas(es) into the process stream within the inlet nozzle or downstream within the reactor chamber. Alternatively, an igniter can be inserted through the universal connector port 360, or similar, port to initiate combustion reactions within the reactor chamber.

Figure 16:
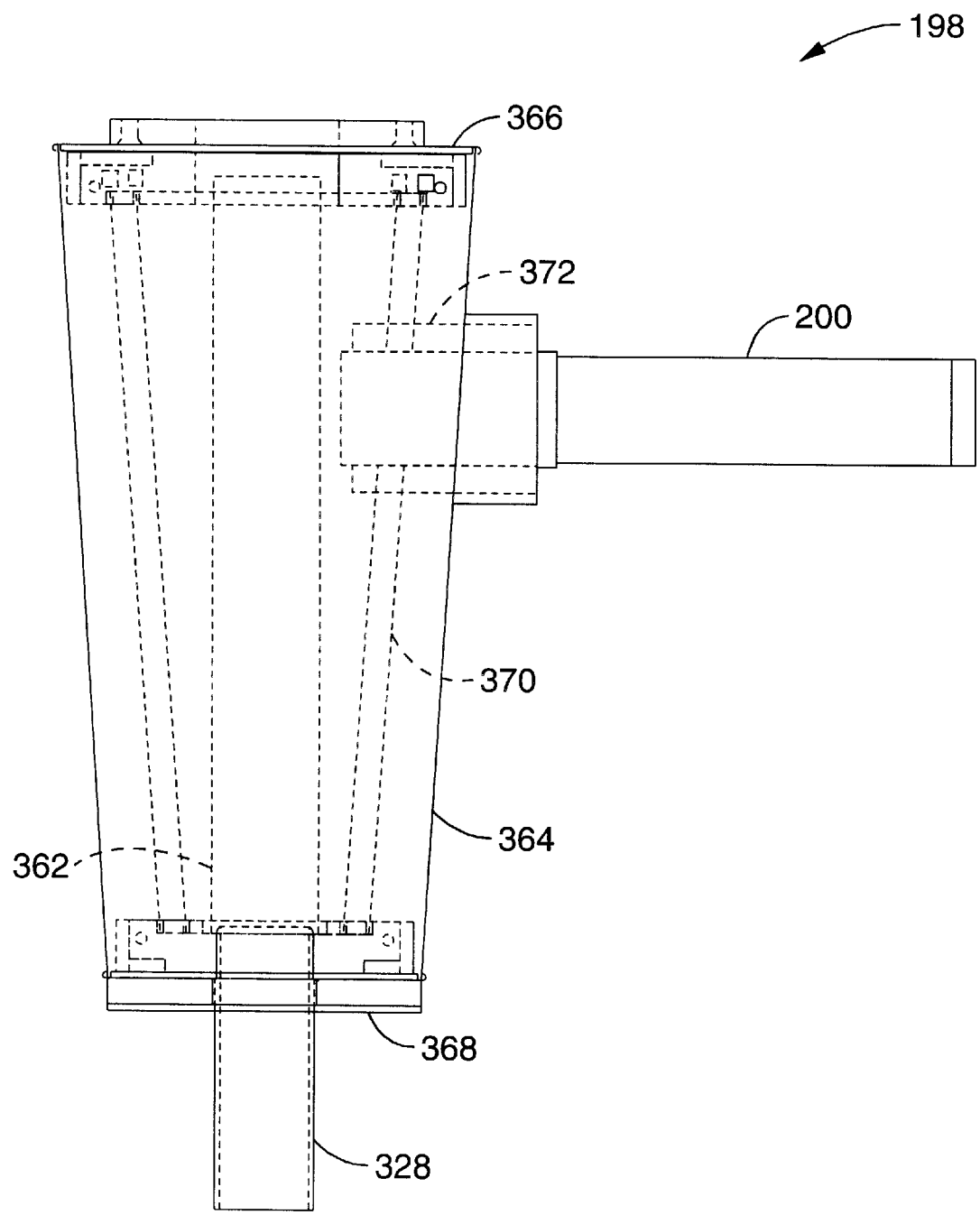
FIG. 16 is a partial cross-section view of the thermal reactor showing an insulating wall through which the heated gas is delivered to a porous cylindrical core.

The housing 198 of the porous wall thermal reactor (PWTR) 152 is shown in FIG. 16 with a porous wall core 362. The exterior shell 364 of the housing 198 is shown attached between an upper housing plate 366 and a lower housing plate 368. The process gas exhaust tube 328 is shown attached within the lower housing plate in fluid communication with the core 362. An intermediary wall 370, shown in a preferred insulated configuration, is positioned between the porous wall core 362 and the exterior shell 364 of the thermal reactor 152. The interior area of the thermal reactor bounded by the intermediary wall 370 forms the reaction chamber for the thermal reactor, with the exterior of the intermediary wall providing insulation to reduce energy loss and reduce the risk of burn injuries. The annular area disposed within the housing 198 but outside of the reaction chamber may be filled with insulation layers, various forms of conventional high-temperature insulation may be utilized, such as fibrous insulation. The output of the heater 200 is directed to the reaction chamber which is interior of the intermediary wall 370. A ceramic conduit 372 between the exterior shell 364 of the thermal reactor and the intermediary wall 370 directs the hot gases to the reaction chamber. To simplify maintenance and cleaning, the porous wall core 362 of the thermal reactor is preferably configured having an internal cylindrical volume, bounded by the porous wall tube.

Figure 17:
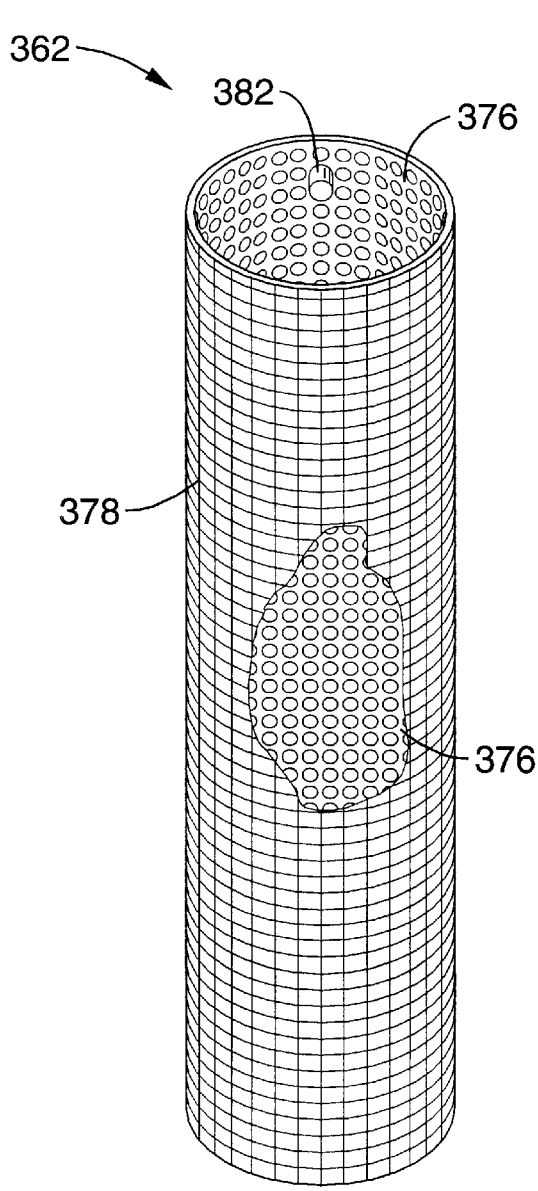
FIG. 17 is a perspective view of a porous wall cylindrical core for use within the thermal reactor shown in FIG. 16 according to an aspect of the present invention.
Figure 18:
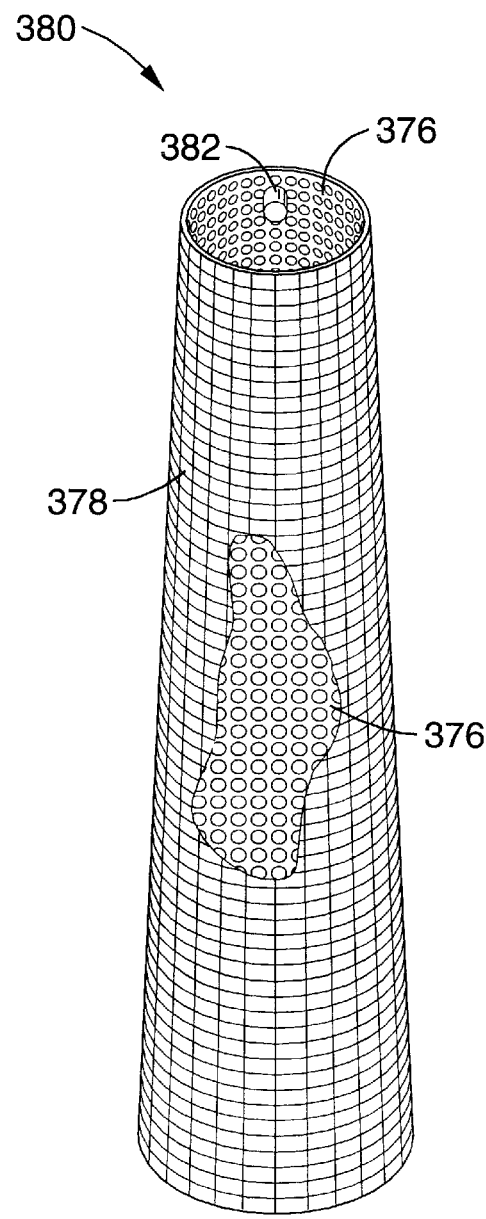
FIG. 18 is a perspective view of a porous wall conical core for use within thermal reactors according to another embodiment of the present invention.

The porous wall core 362 as shown in FIG. 17, is preferably constructed with an inner tube 376 comprising a perforated alloy sheet rolled and welded to the nominal dimensions. The second part of the tube, preferably the outer portion, comprises a fine mesh alloy screen 378 which is rolled and attached, such as by welding, to the inner tube 376. It will be appreciated that the mesh may be alternately, or additionally, attached to the inner surface of the inner tube, although this is perhaps less preferable due to manufacturing considerations. FIG. 18 is an alternative embodiment of the porous wall core 380 that is configured for use within a cylindrical reaction chamber, to maintain a similar spacing from tube to wall when using a cylindrical core in a conical housing. The tubes preferably contain a retention mechanism, such as exemplified within the embodiment with a locking pin 382 proximal to the upper end of the tube. The inner tube 376 provides the physical support structure for the outer tube 378 which ensures balanced hot reagent distribution into the reactor chamber. Thus, preheated reagent gas is introduced through the porous reactor wall which mixes with the process stream. The hot reagent gas causes reaction of these chemical species, thereby creating new chemical constituents including gas and particulate matter. The process stream constituents are shielded from the reactor wall by the intruding hot reagent gas. This shielding effect requires that the pressure across the fine mesh alloy screen remain relatively constant as the chemical process mixture traverses the reactor chamber.

Figure 19:
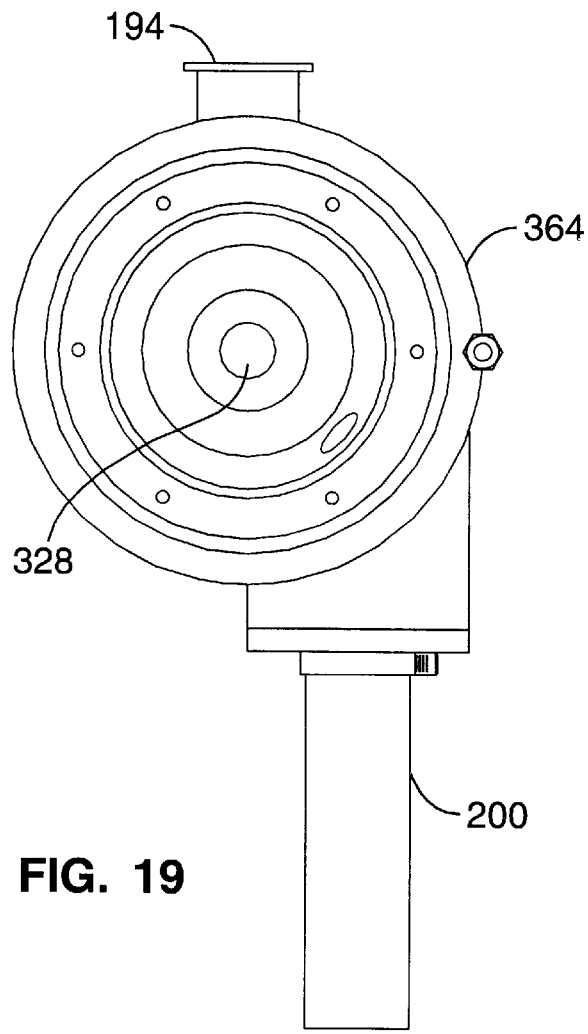
FIG. 19 is a top plan view of the thermal reactor housing without the reactor core, which shows the tangential heater input.
Figure 20:
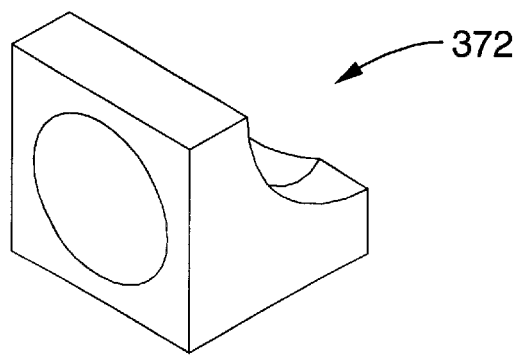
FIG. 20 is a perspective view of a ceramic conduit for use within the thermal reactor of FIG. 16.

FIG. 19 is a top view of the porous wall thermal reactor housing 198 with the inlet head removed wherein the relationship of the heater 200, exterior shell 364, inlet port 194 and process gas exhaust 328 may be seen. FIG. 20 shows the ceramic conduit 372 for mounting within the PWTR for directing the heated gas to the interior of the reaction chamber.

The preferred embodiment of the porous wall tube provides high thermal conductivity, low thermal mass, low pressure drop, and oxidation resistance. One of the chief objectives of the modular system is to facilitate reconfiguration and maintenance. To this end, the desirability of low thermal mass should be appreciated. The core of typical porous wall thermal reactors (PWTRs) utilizes thick ceramic materials contained within the reactor housing. These ceramic materials have a large thermal mass and are therefore very slow to cool down sufficiently to allow for replacement. The present invention by contrast is designed using different materials and operating principles so that a core with low thermal mass and pressure drop may be utilized.

The operating principle of the PWTR of the present invention should be understood so as to appreciate how the present invention is capable of utilizing a design with low thermal mass and low pressure drop. An inherent requirement of this approach is maintaining a relatively equal pressure distribution across all of the orifices comprising the porous reactor tube. Four features of the reactor substantially maintain this critical pressure balance: (1) the hot reagent gas flow; (2) the mesh size utilized within the alloy screen; (3) the injection of the hot reagent at the top of the housing which is directed tangentially to the porous wall tube; (4) the complimentary geometric shapes of the porous reactor tube and the reactor housing elements. Three preferred geometries of the porous reactor tube and reactor housing facilitate PWTR operation and are configured as either: (1) a cylindrical porous reactor tube within an inverted conical reactor housing; (2) a conical porous reactor tube within a cylindrical reactor housing; or (3) a conical porous reactor tube with inverted conical reactor housing. The reactor housing elements also contribute to the overall efficiency and ease of reactor maintenance.

The heat recovery feature of the PWTR modules, coupled with their low thermal mass heater, substantially reduces heat loss; while the insulation eliminates a hot surface hazard which would otherwise exist relative to the outer reactor housing. The core is located near the center of the reactor contained within the inner walls of the reactor section. To pass the gasses through the insulating outer area to the reactor chamber, an insulated conduit is preferably connected between the exterior shell and the reaction chamber interior of the intermediary wall. The preferred embodiment of the thermal reactor reduces both the cost of fabrication and the energy requirement sufficiently to make individual treatment of process exhaust streams economically feasible. Furthermore, to enhance modularity while increasing efficiency, a number of parameters of treatment may be individually controlled, such as, the reagent gas flows of individual reactors, the addition of reagent gases (added through the inert gas sleeve or an injection nozzle extending into the inlet nozzle), and the temperature of operation. In addition, the individual treatment of the process exhaust streams precludes problems with mixing incompatible gases thereby preventing undesirable events ranging from the formation of secondary hazardous byproducts to explosive reaction of highly energetic molecules. Thus, processed chemical constituents are swept through the reactor and mixed with cool gas from the cooling air sleeve prior to entering the subsequent scrubbing unit.

Conventional reactor cores operate by different principles and utilize ceramics, metal-ceramic composites (either sintered or unsintered), or various other compositions; typically including a ceramic material. These ceramic porous walls often use a composite matrix having a binder. The thickness of the composite typically being in the range from one-quarter inch to one-half inch. The internal porosity may account for up to 45% of the volume with average pore sizes of 37 microns or less in diameter.

The PWTR of the invention, however, utilizes a metal mesh for providing reagent gas distribution, not for facilitating combustion, radiant functions, or catalysis. The preferred embodiment of the PWTR porous wall tube requires the use of a metal mesh which is extremely resistant to high temperature oxidation and in which no catalytic activity is required. Preferably the mesh utilized has a 200×200 mesh screen, although the mesh can range from 25×25 to over 500×500 depending on wire size, structure, and construction. The 200×200 mesh of the present PWTR provides an open area of 34% with average opening size of 74 microns or more in diameter. A comparison of pressure drop versus flow rate for a porous composite matrix and the PWTR tube further distinguishes the flow characteristics of the two approaches. For a flow rate of about 7 cubic feet per minute (cfm), the pressure drop in the composite matrix exceeds 8 inches of water column; while the pressure drop across the PWTR tube is less than 0.1 inch of water column. The extremely low pressure drop across the PWTR tube highlights the importance of the component geometries and reagent gas flow control. It will be appreciated, therefore, that the porous wall reactor tube, as a single layer alloy mesh, creates a multitude of low pressure drop orifices rather than a relatively thick granular or fibrous matrix of ceramic or metal which is compressed or fused together to create a multiplicity of relatively high pressure drop "tortuous paths" (i.e. permeable wall).

In addition, the low thermal mass and high thermal conductivity allows for rapid component cooldown, and a reduced "warm up period" during startup, while providing mechanical strength and dimensional stability which are critical for allowing rapid maintenance access and simple component replacement. These concepts are fundamental to fully realizing the benefits of component modularity.

Figure 21A:
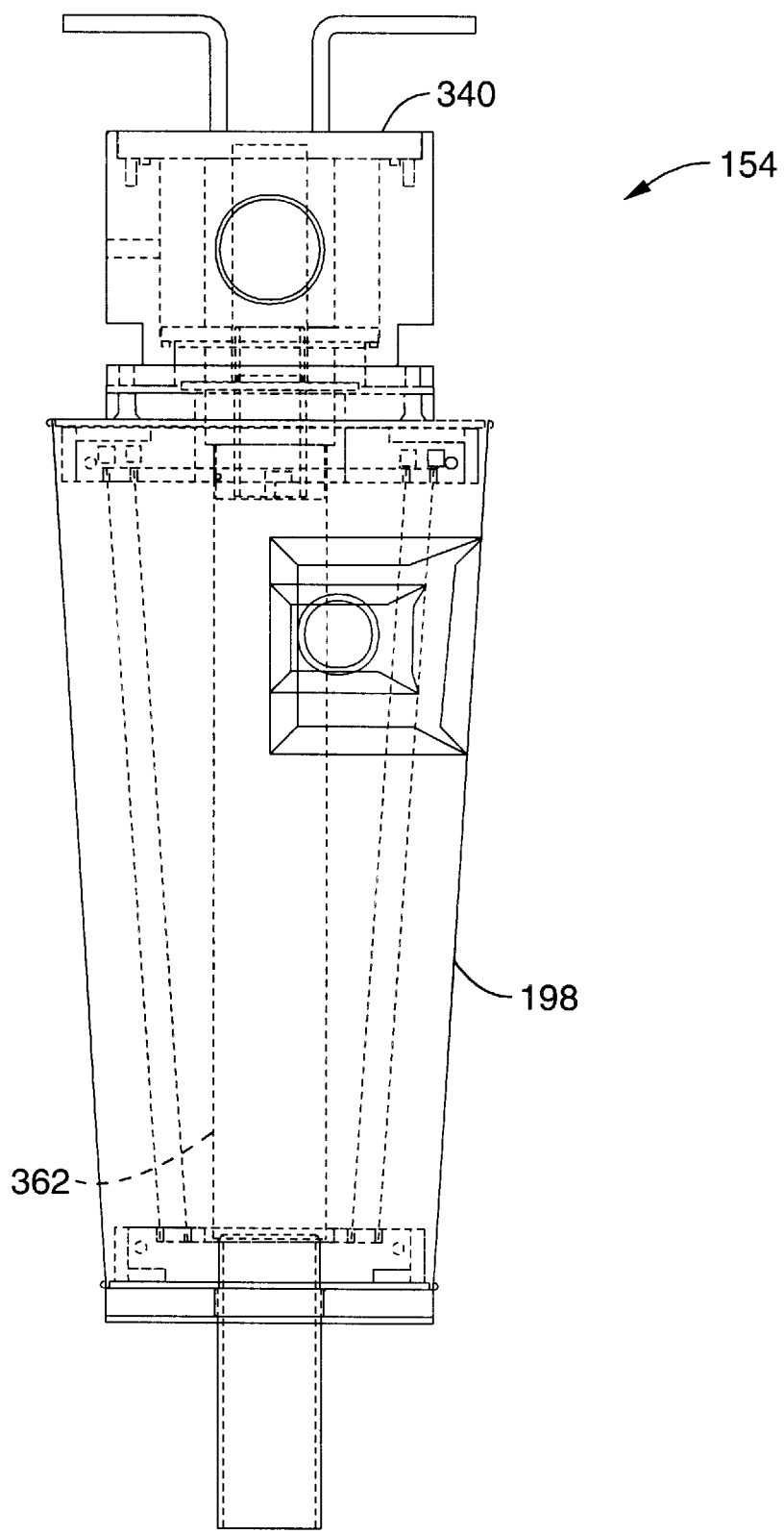
FIG. 21A is a side view in cross-section of a thermal reactor according to an embodiment of the present invention shown assembled with the core assembly.
Figure 21B:
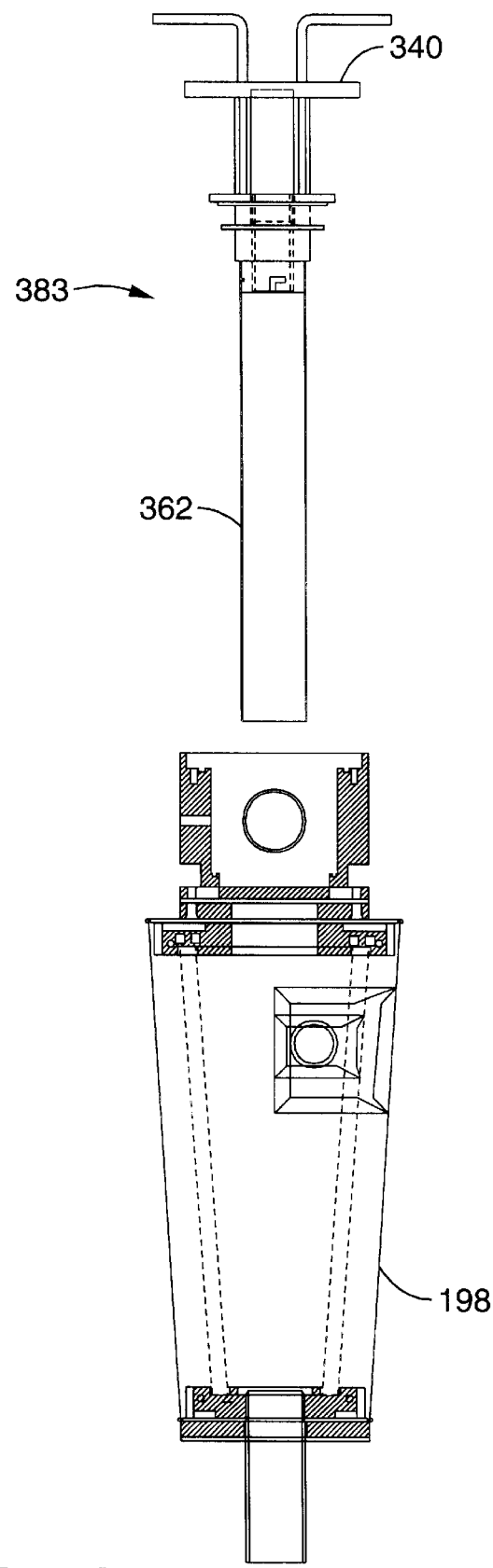
FIG. 21B is a cross-sectional view of the thermal reactor of FIG. 21A shown with the core assembly removed from the reactor housing.

To further support the system modularity, the porous wall thermal reactor (PWTR) 154 as shown in FIG. 21A contains an integral core 362 attached to the inlet head 340 as a core assembly. The core assembly is designed to be removed as a single unit in a simple operation, as is shown in FIG. 21B wherein the core assembly 383 comprising the inlet head 340 and the porous wall core 362 have been removed. The integral core design coupled with the other beneficial factors allow for interchanging of cores to optimize the geometry of the reactor for different hot reagent flow and process stream flow requirements.

Figure 22:
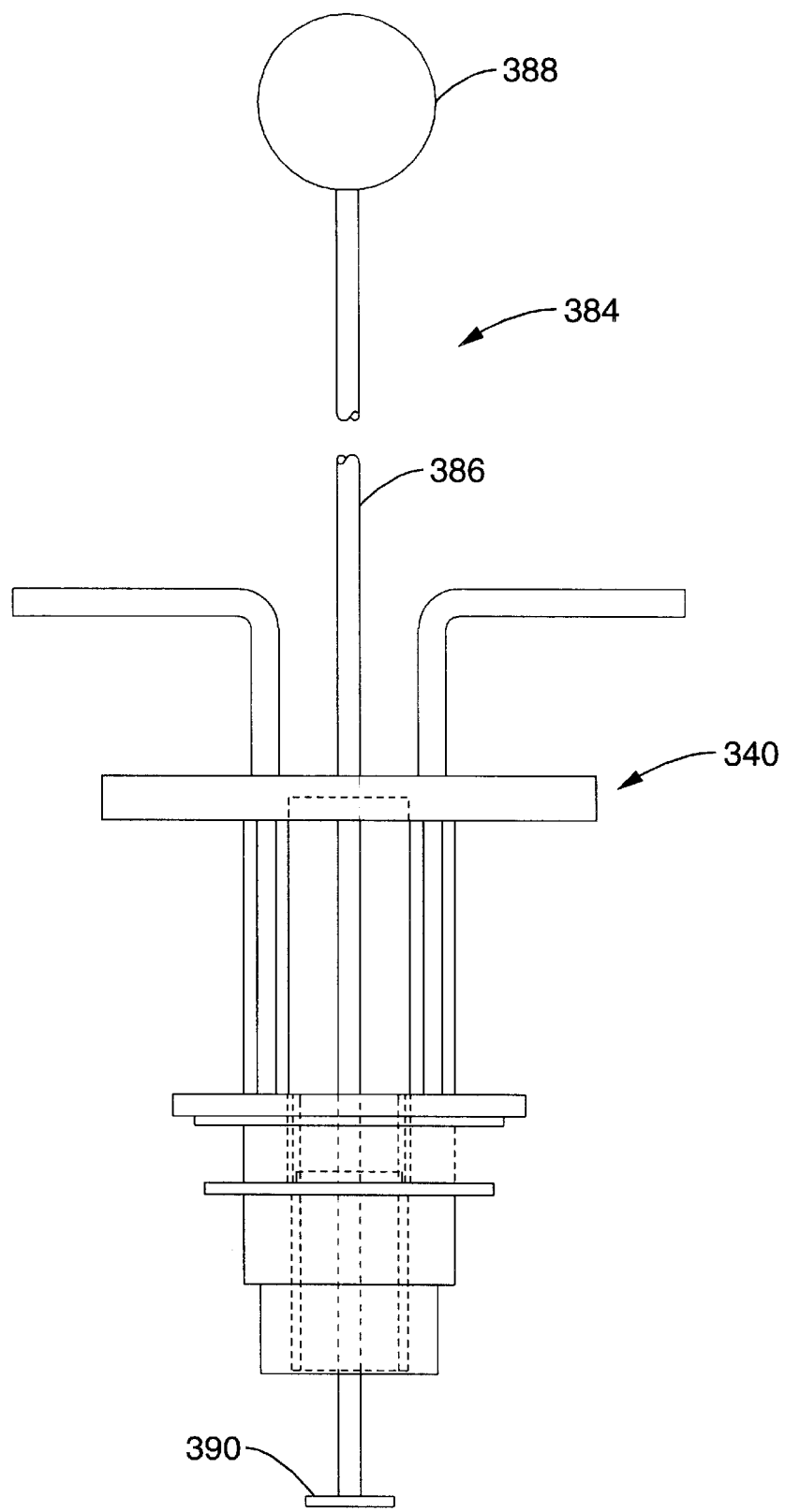
FIG. 22 is a side view of the sleeve nozzle of FIG. 15 shown configured with a slidably engaged porous thermal core cleaning device.

When the reactor becomes less efficient, perhaps as detected by an increase in the aforementioned back pressure, the reactor core should be either cleaned or replaced. FIG. 22 depicts an additional cleaning feature which facilitates reaction efficiency and low maintenance overhead. The sleeve nozzle 340 of the thermal reactor is shown with a cleaning device 384 slidably inserted therein. The cleaning device 384 comprises a rod 386 having a handle 388 attached to a proximal end, and a core cleaning element 390 attached to the distal end. When inserted within a PWTR the handle may be manipulated up and down SO that the cleaning element 390 is brought into contact with the interior of the core to clear the straight-through process flow path without the need of an equipment shutdown. Should the porous wall tube need replacement, the top flange of the reactor can be easily disconnected, thereby allowing all components which contact the process stream to be removed as an integral assembly. A replacement porous wall tube and its associated gaskets may be simply connected to the inlet sleeve to form a core assembly that is then lowered into the reactor housing. Upon reconnecting the top flange, the reactor may then be restarted. Typically, a reactor operating at 600° C. can be shut down for service access within 5 minutes and returned to normal operation within 10 minutes. Complete maintenance, as described, can be performed without disconnecting the individual chemical process line or halting any controlled functions of the reactor, and without disrupting the normal operations of the other inlet modules being used within the system. To further reduce the cost of operation, individual reactors can be placed in idle mode to conserve energy whenever upstream process equipment is off-line for maintenance. Additionally, should all reactors be placed in idle mode, the fresh water flow is preferably reduced to a rate which merely compensates for evaporative water loss.

Figure 23:
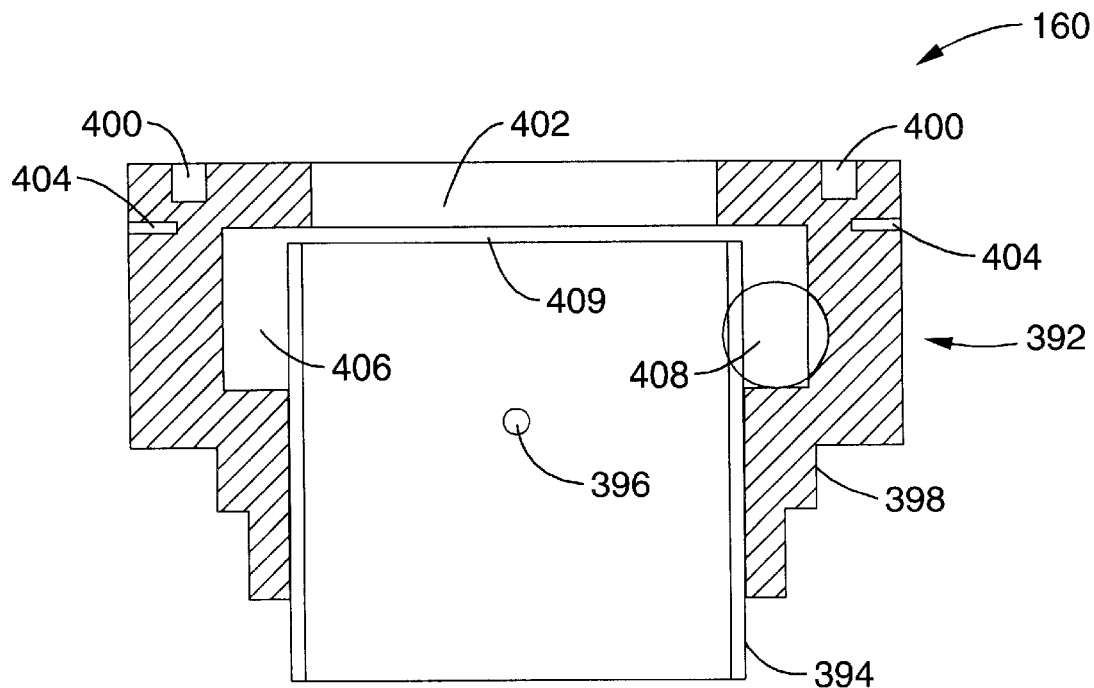
FIG. 23 is a side view in partial cross-section of a universal cooling air sleeve according to an aspect of the present invention.
Figure 24:
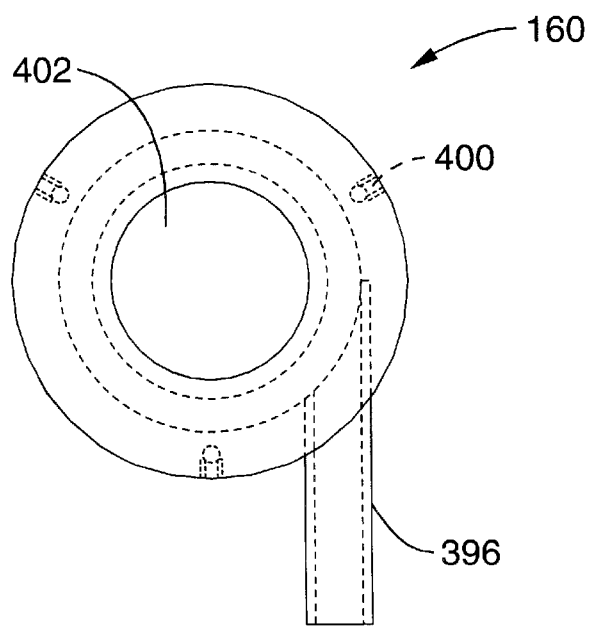
FIG. 24 is a top view of the universal cooling air sleeve of FIG. 23, showing the air inlet tube.
Figure 25:
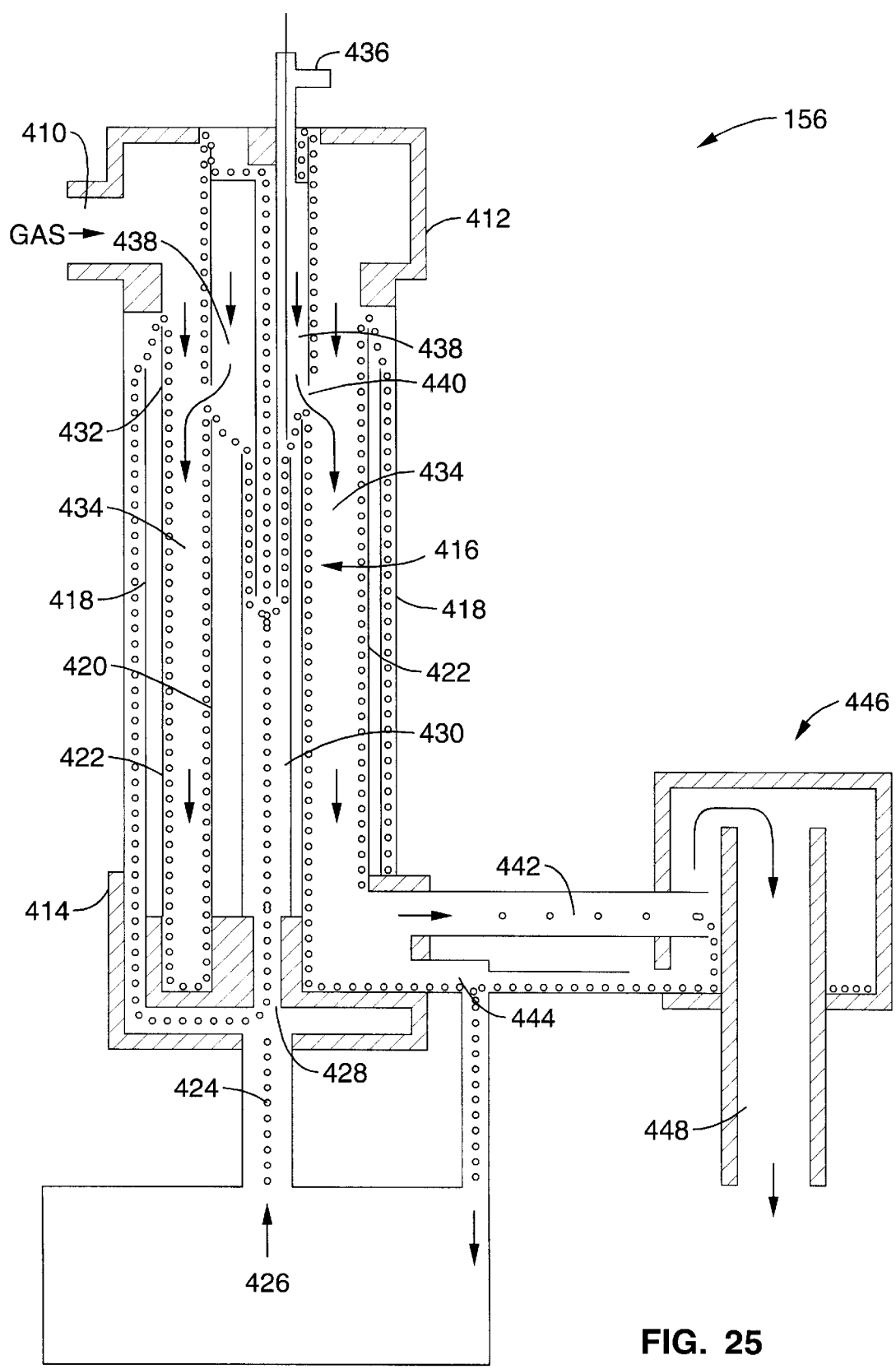
FIG. 25 is a schematic diagram showing the operation of a falling film plasma reactor according to an aspect of the present invention.

The universal cooling air sleeve 160 is shown in FIG. 23 and FIG. 24 which provides a universal modular coupling for mounting any of a variety of inlet modules to the primary scrubber of the system. The universal cooling air sleeve 160 comprises a base member 392, which is preferably circular, into which a sleeve 394 has been attached, such as by pin 396. The length and type of sleeve may be preferably changed to alter the mixing characteristics of the process gas entering the primary scrubber. The lower portion 398 of the base member 392 is configured for sealed attachment to an opening in an upper surface of the primary scrubber to which it may be attached with fasteners which are inserted through recesses 400. When attached to the primary scrubber, the base member 392 is capable of receiving an inlet module into throat 402, wherein a fastener attached to the inlet module 402 engages a mating fastener 404 attached or configured within the base member 392. An annular ring 406 receives cooling air through an air inlet tube 408, such that the cooling air may be directed through a slot 409 between the base member 392 and the annular ring 406 for cooling the process gas as it begins to enter the primary scrubber. It will be appreciated that the annular ring 406 may be configured in various ways to direct the flow of the cooling air for specific applications.

The cool air, or gas, is received through an air inlet tube 408 which directs the gas for tangential injection into the cylindrical housing of the base member 392 for distribution within the tubular sleeve 394. A ring-shaped aperture 406 is formed by the upper end of the tubular sleeve and the inside upper face of the cylindrical housing to ensure equal air flow. The tubular sleeve 394 can easily be replaced to vary length and thickness. Thus, the volume and velocity of the applied cooling can be varied to address various process stream treatment requirements. Consider the example of the universal cooling sleeve 160 into which is retained a thermal reactor. The inlet exhaust nozzle of the thermal reactor extends into the universal cooling air sleeve, such that cool air isolates the exhaust nozzle from the droplets and vapor of the scrubbing liquid. The process gas mixture, additional nitrogen, and clean, dry air are thereby swept from the thermal reactor into the subsequent scrubbing unit.

The cooling air sleeves simultaneously dilute and cool the individual pretreated process streams as well as prevent the liquid mist and vapor within the spray chamber from contacting the exhaust nozzles of the inlet. Thus, the dilution minimizes the risk of undesirable chemical reaction or physical accumulation, while cooling reduces liquid vapor formation and the consequent nucleation of liquid aerosol, and the air sleeve precludes the wetting of critical surfaces subject to corrosion or particulate accumulation.

In keeping with the ability to address a variety of treatment regimens within the modular system of the invention, the flow of air, or gas, through the universal cooling air sleeve is preferably regulated. The regulation may be provided by an electronic valve that is manipulated by the control electronics. However, for a large number of treatment applications the flow of cooling air may be preferably controlled by utilizing interchangeable flow orifices, which restrict air flow to a predetermined level. The amount of cooling air required for a particular application is determined largely by the reactor, or inlet type, and the process stream treatment requirement. Selecting nominal gas flows for treating individual process streams reduces the demands placed upon subsequent modules used to treat the combined process stream.

To facilitate control of the modular system various parameters of the inlet modules are monitored such that the controller may optimize the process, provide for safety alerts and shut-downs, and facilitate the scheduling and performance of maintenance. One such parameter that is monitored within the exemplified embodiment is the pressure of the process stream within each thermal reactor. For example, the use of pressure monitoring within the inlet heads of the thermal reactors to register the process stream pressure. One benefit of monitoring the pressure is that the registration of back pressure provides a measure of reactor core condition. The back pressures on all process lines are therefore individually and simultaneously monitored.

In summary, the PWTR of the present invention provides numerous inherent advantages including simplicity, low cost, robustness, adaptability, and serviceability, which result from the novel approach utilized.

The third inlet module shown in FIG. 5 is a falling film plasma reactor 156 (FFPR). The electrical energy deposited into the plasma dissociates atoms and molecules of the gas stream constituents generating energetic electrons and reactive chemical species. Subsequent reaction of these chemical species creates new chemical constituents including gas and particulate matter which in the course of flowing through the reactor contacts the liquid flowing over the electrodes. Consequently, constituents of the chemical process stream are absorbed or reacted with the liquid and its constituents. For efficiency, the surface area for the plasma reaction should be maximized. The FFPR of the present invention utilizes a series of concentric sleeved sections, preferably cylindrical, through which gases are passed. Furthermore, the FFPR utilizes a liquid dielectric which is made to flow as a film over the conductors, thus the term "falling film" so as to provide an efficient dielectric that is not prone to shorting. The process stream is introduced into the FFPR 156 through the inlet 410 at the top insulating endpiece 412 which together with a bottom insulating endpiece 414 maintain the concentric and tubular geometry of the annular layers of the FFPR. The process stream is distributed and flows through the annulus formed between the exterior of an inner core 416 and the interior of an outer cylindrical wall 418. The inner core 416 and outer cylindrical wall 418 comprise nested tubular sections and passageways for the distribution of liquids and gases. The exterior surface of the inner core 416 has been configured with metallic surfaces 420 which are connected as a first electrode, while portions of the inner surface of the outer cylindrical wall 418 have been similarly configured as a second electrode 422. A liquid dielectric 424 is then made to flow over both the inner and outer electrodes 420, 422 to provide a dielectric barrier over the electrodes as the process gas (shown by the arrows) passes between the electrode surfaces. The dielectric liquid is introduced from a liquid cooling and distribution module 426 to a liquid inlet 428 at the bottom insulating endpiece 414 and distributed through a distribution stalk 430 within the inner core 416 to flow over the two separated sections of inner electrode 420, and similarly through a channel in the outer cylindrical wall 418 to flow over the second electrode 422. The dielectric liquid is distributed over the inner and outer dielectric barriers using weirs 432. The configuration of the inner dielectric distribution channel within the core 416 is more complex than that within the outer dielectric cylinder 418, as the core 416 contains both and upper and lower weir and associated falling film. The plasma is created within the annulus 434 between the first electrode 420 and the second electrode 422 by applying a high voltage source between the electrodes to create a plasma region therein. The process stream flows toward this plasma region and is in contact with the dielectric liquid 424. Prior to entering the plasma region, reagent gas is introduced into a reagent gas inlet 436 at the upper end of the FFPR 156 and is directed through an outer transfer tube 438 and then exits through a circular slot 440 where it enters the annulus 434 and mixes with the process stream. The combined process stream is thereby treated in the plasma region within the annulus 434 and exits the FFPR at the process outlet of the 442 of the bottom insulating endpiece 414. The bulk of the dielectric liquid 424 is separated from the treated process stream and exits the FFPR at the liquid outlet 444 of the bottom insulating endpiece 446. The dielectric liquid 424 contacts the process stream during and after plasma treatment such that heat energy and reaction products may be captured and absorbed within the dielectric liquid 424. Therefore, the liquid is cooled and filtered prior to recirculating through the FFPR. Some of the dielectric liquid may be entrained by the treated process stream, therefore, a phase separator 446 is connected to the process outlet of the FFPR 156 to collect and recycle residual dielectric liquid 424. The treated process stream exits the phase separator at an exhaust 448 to enter the primary scrubber through a universal cooling air sleeve.

A falling film plasma reactor (FFPR) provides a number of benefits for the treatment of process gases. The falling film plasma reactor uses high voltage alternating current or pulsed direct current which is applied to radially separated electrodes to thereby create a dielectric breakdown of the process gas that is flowing within the large radial gap between the two electrodes. Typical plasma reactors often utilize fixed dielectric construction which can result in potential failure of the device by arcing between the electrodes as portions of the dielectric fails. These failures are prevented by using a dielectric liquid that constantly flows over the electrodes, or over a fixed dielectric barrier over the electrodes. A conductive liquid may also be utilized within the FFPR design such that the electrode itself is being constantly "renewed". Appropriate dielectric liquids are preferably those having a dielectric strength of approximately 30 kilovolts per millimeter, no flash point, low vapor pressure, a use temperature above 200 degrees centigrade, and high resistance to chemical reaction. Critical purposes of the dielectric liquid are: (1) to cool the electrodes and the solid dielectric barriers (if used); (2) to provide a dielectric barrier to arcing or enhance the dielectric barrier in combination with a solid dielectric material (if used); and (3) to distribute the electrical charge more uniformly on and around the dielectric surfaces to preclude charge localization which otherwise can lead to catastrophic arcing. An example of an appropriate conductive liquid is a $10^{-4}$ molar solution of calcium carbonate in water. Materials can be added to the dielectric or conductive liquids to enhance their physical, electrical, and chemical performance for specific processing applications. High dielectric materials such as fine aluminum oxide particles can be added to increase the dielectric strength of the liquid and increase the effective viscosity of the liquid. Ionic materials such as calcium carbonate can be added to increase the electrical conductivity of the liquid and increase chemical removal of gases such as chlorine and fluorine.

A preferred embodiment of the falling film plasma reactor for the modular abatement application is shown in FIG. 26 through FIG. 29. The preferred embodiment of FFPR 156 comprises four subassemblies: the inner electrode assembly of FIG. 26, the outer electrode assembly of FIG. 27, the reactor housing assembly of FIG. 28, and the separator and mounting bracket of FIG. 29.

Figures 26, 27:
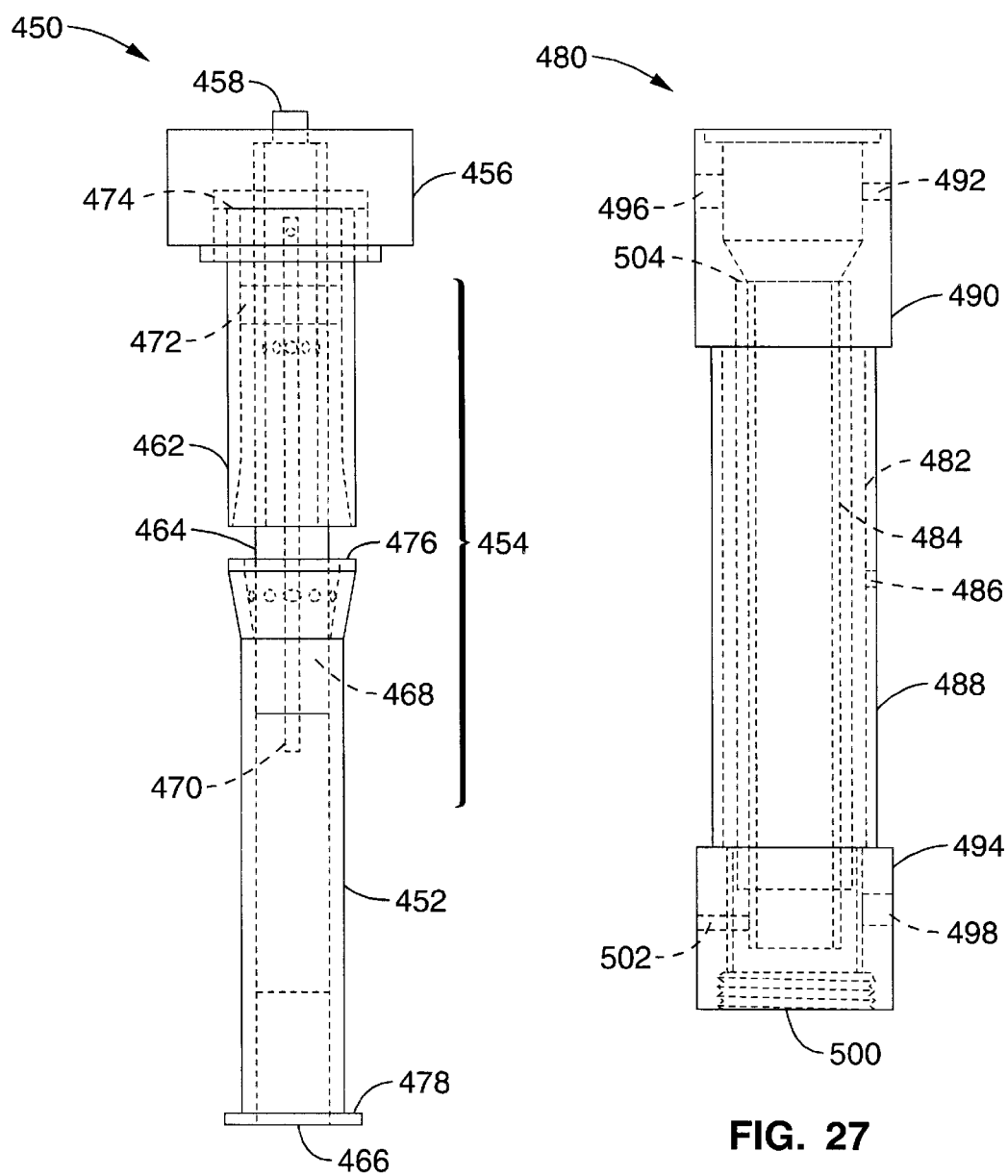
FIG. 26 is a side view of an inner electrode assembly for a falling film plasma reactor according to an aspect of the present invention.
FIG. 27 is a side view of an outer electrode assembly for a falling film plasma reactor whose inner electrode is shown in FIG. 26.

The inner electrode assembly 450 of FIG. 26 comprises an electrode with an associated lower dielectric barrier 452, distribution stalk 454, a reactor top plate 456 having an electrical feedthrough 458 for receiving electrical wiring and a reagent gas. An upper film support 462 and a lower film support, on the exterior of the lower dielectric barrier 452, provide the electrode surfaces over which the dielectric film layer is to be disbursed. An outer transfer tube 464 retains the liquid in a column from the liquid inlet 466. The reagent enters the feedthrough 458 in the reactor top plate 456 and is introduced into the top of the outer transfer tube 464 for combination with the process stream within the reactor annulus. The dielectric liquid fills the outer transfer tube 464 up to and including the lower weir 468, and since the liquid is under pressure from the reagent gas it is driven through an inner transfer tube 470 up into the upper weir 472. The distribution stalk 454 initiates the liquid falling film in two places along the length of the inner electrode 450. The dielectric is distributed over the electrodes from outlet 474 at the upper surface of the upper weir 472 to provide a falling fluid film over the upper film support 462, while liquid similarly falls from outlet 476 at the upper surface of the lower weir 468. A solid ring 478 is preferably located at the base of the inner electrode assembly which upon removal cleans the inner surface of the outer electrode assembly.

The outer electrode assembly 480 of FIG. 27, comprises an outer electrode 482 with associated dielectric barrier 484 and electrical feedthrough 486, an outer insulating tube 488, a top insulating endpiece 490 which initiates the liquid falling film in one place and introduces the process stream, and a bottom insulating endpiece 494 which exhausts the treated process stream and dielectric liquid while reintroducing the dielectric liquid for distribution to the inner and outer electrode assemblies. The top insulating endpiece 490 provides a port 492 for process stream pressure monitoring. Thus, the back pressures on all process lines are individually and simultaneously monitored. A process gas inlet 496 receives the gas for treatment which is delivered through a process output 498. The liquid for the FFPR is input through the inlet 500 and output after circulation through outlet 502. During treatment the dielectric liquid flows over the electrode from falling outlet 504.

Figure 28:
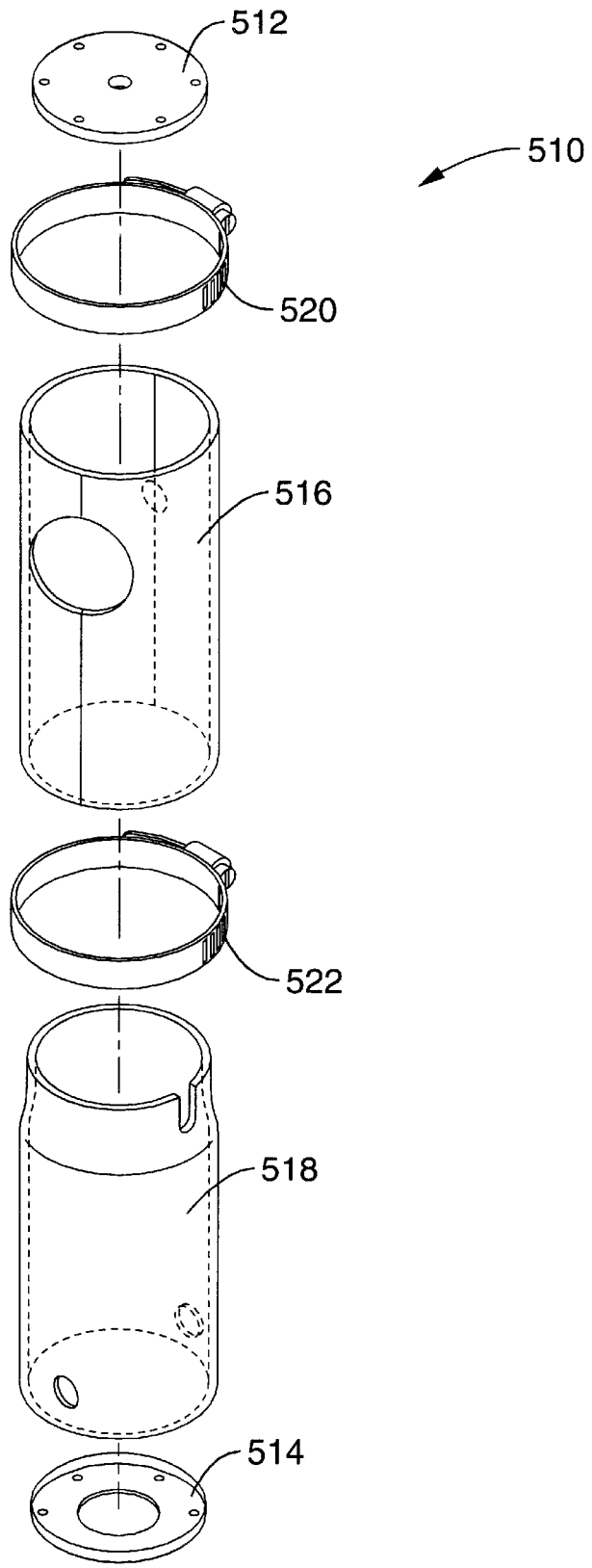
FIG. 28 is a perspective exploded view of a protective housing to surround the falling plasma reactor whose outer electrode is shown in FIG. 27.

A reactor housing assembly 510 as shown in FIG. 28, which provides EMI shielding and structural support. The reactor housing assembly 510 comprises a top endcap 512, a bottom endcap 514, a top sleeve 516, and a bottom sleeve 518 which are attached to the outer electrode assembly of the plasma reactor by fastening clamps 520, 522. To provide proper shielding, the sleeves and endcaps are preferably fabricated from metal.

Figure 29:
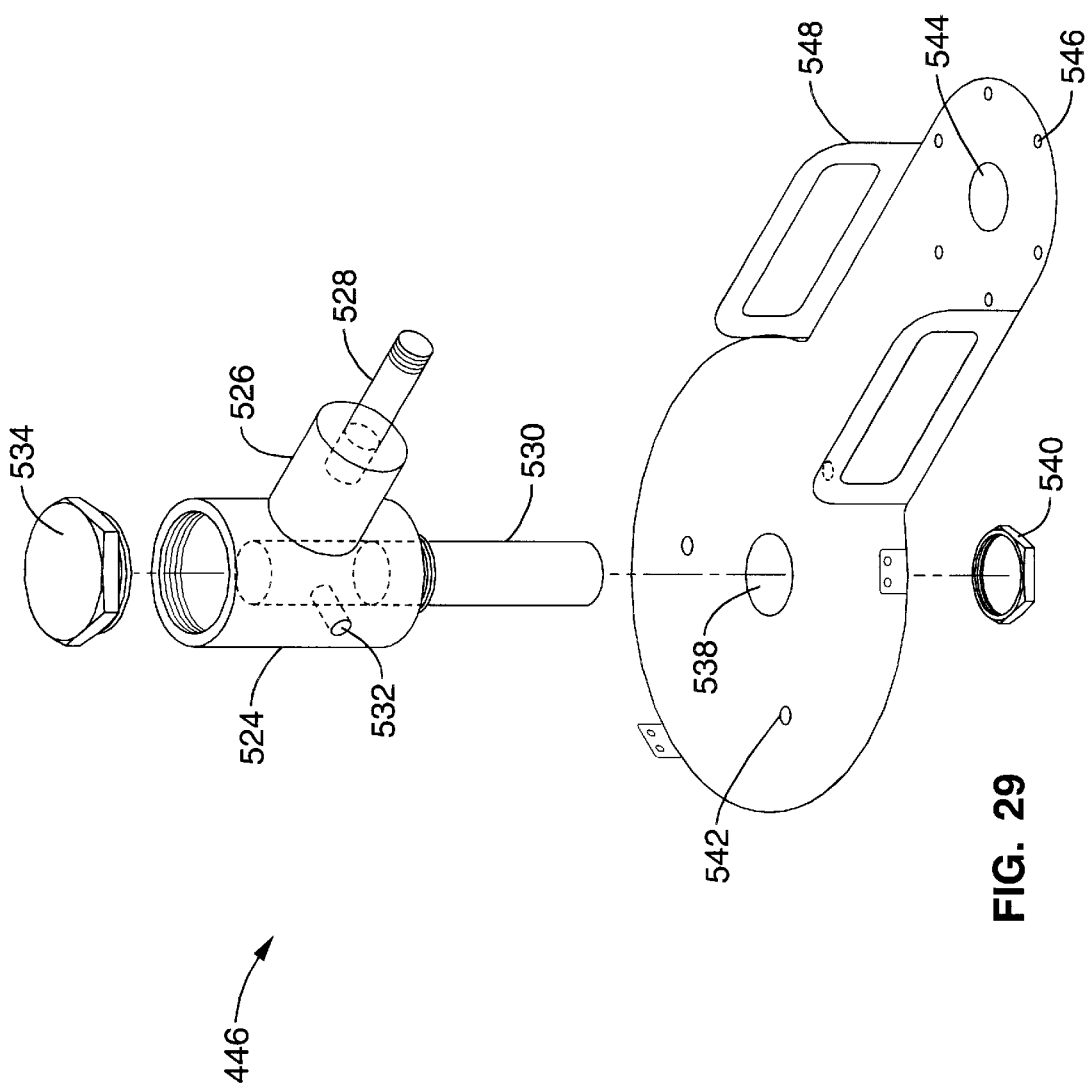
FIG. 29 is a perspective exploded view of a liquid/gas phase separator shown with a reactor mounting plate which may be connected to the falling film plasma reactor according to an aspect of the present invention.

A phase separator 446 as shown in FIG. 29 separates entrained liquids from the process gas being exhausted from the falling film plasma reactor. A pipe housing 524 is configured with an inlet chamber 526 with an inlet jet 528 for receiving treated process gas from the FFPR. An exhaust nozzle 530 is fitted to the underside of the pipe housing 524. A liquid outlet port 532 directs the liquid back for reuse in the FFPR. A threaded-cap 534 seals the housing but can be removed for cleaning the separator. Entrained liquid through the inlet jet impacts on the upper portion of the exhaust nozzle 530 for collection thereof, while the process gas passes from inlet to exhaust.

The FFPR comprises inner and outer electrode assemblies that may be quickly separated to simplify and speed maintenance procedures. The inner electrode assembly may be lifted out of the outer electrode assembly after disconnecting the top endcap and reactor top plate. As the inner electrode assembly is lifted out, the integral cleaning mechanism clears the annular flow path. The cleaning mechanism is similar to the cleaning device described for the thermal reactors and comprises a solid ring attached to the lower end of the inner electrode assembly and having an outside diameter nearly equal to the inside diameter of the outer electrode assembly. When required, replacement of reactor components or extensive cleaning is facilitated by easy access to all reactor components. In general, the components of the FFPR are assembled using conventional threads, close tolerance fits, or O-ring seals. The liquid reservoir, pump, and filtration system are modular and accessible to facilitate maintenance or replacement. The complete maintenance described can be performed without disconnecting the individual chemical process line and while the other three reactors continue normal operations.

Several control subsystems are critical to the implementation of the diverse technologies integrated as interchangeable and modular components, and to the optimization of the treatment technologies associated with each particular process stream. Three control subsystems are utilized within the modular abatement system are pneumatic control, hydraulic control, and electrical control.

Figure 30:
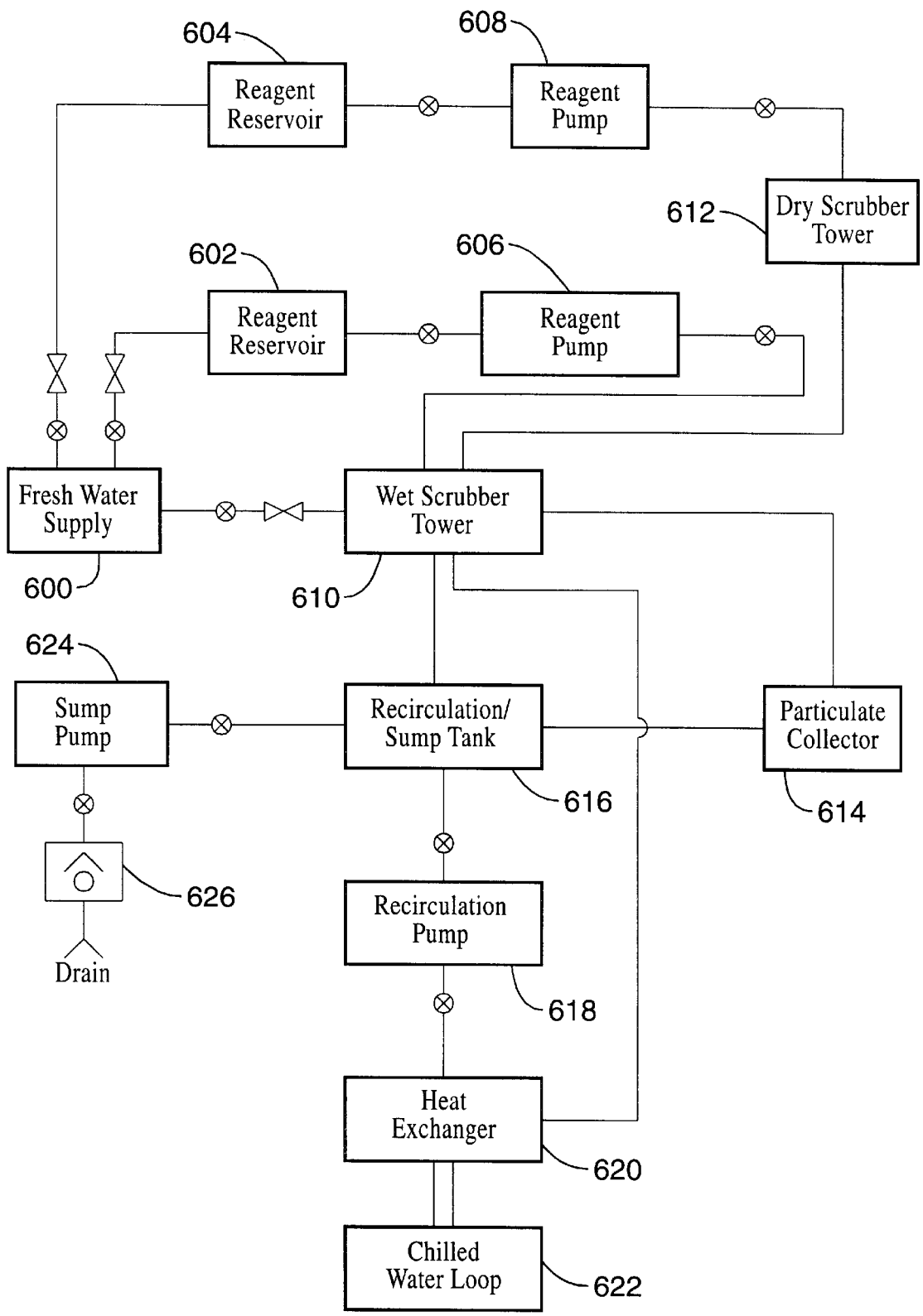
FIG. 30 is a block diagram of the system hydraulic flow according to an embodiment of the present invention.

FIG. 30 shows a flow diagram which exemplifies the hydraulic control subsystem within the modular abatement system. The hydraulic control subsystem includes the fresh water supply 600, the liquid spray chamber 610 (or primary wet scrubber), the recirculation loop 616, the sump drain 626, the wet scrubber reagent supply 602, the wet scrubber tower 610, the dry scrubber reagent supply 604, the dry scrubber tower 612, and the particulate collector 614. Fresh water 600 is utilized as the bulk solvent in the liquid spray chamber 616, wet scrubber tower 610, and particulate collector 614. Water may also be used in the reagent formulation for the wet scrubber reagent or dry scrubber reagent. In each instance, fresh water is added using a shutoff valve and restrictive flow orifice. The liquid spray chamber (or primary scrubber) functions as both a wet scrubber and the recirculation-sump tank 616. The integration of these functions permits elimination of a liquid P-trap which precludes a serious maintenance concern. All sources of reagent and recirculation liquid drain into the liquid spray chamber. The recirculation loop 618 includes a heat exchanger 620 to cool the recirculation liquid prior to flowing into the primary spray nozzles (within the primary scrubber chamber), into the secondary spray nozzles (within the secondary scrubber tower), and into the particulate collector 614 spray nozzles. Wet scrubber reagent 602 or fresh water 600 is injected into the recirculation liquid prior to the secondary spray nozzles to maximize the efficiency and capacity of the wet scrubber tower.

Figure 31:
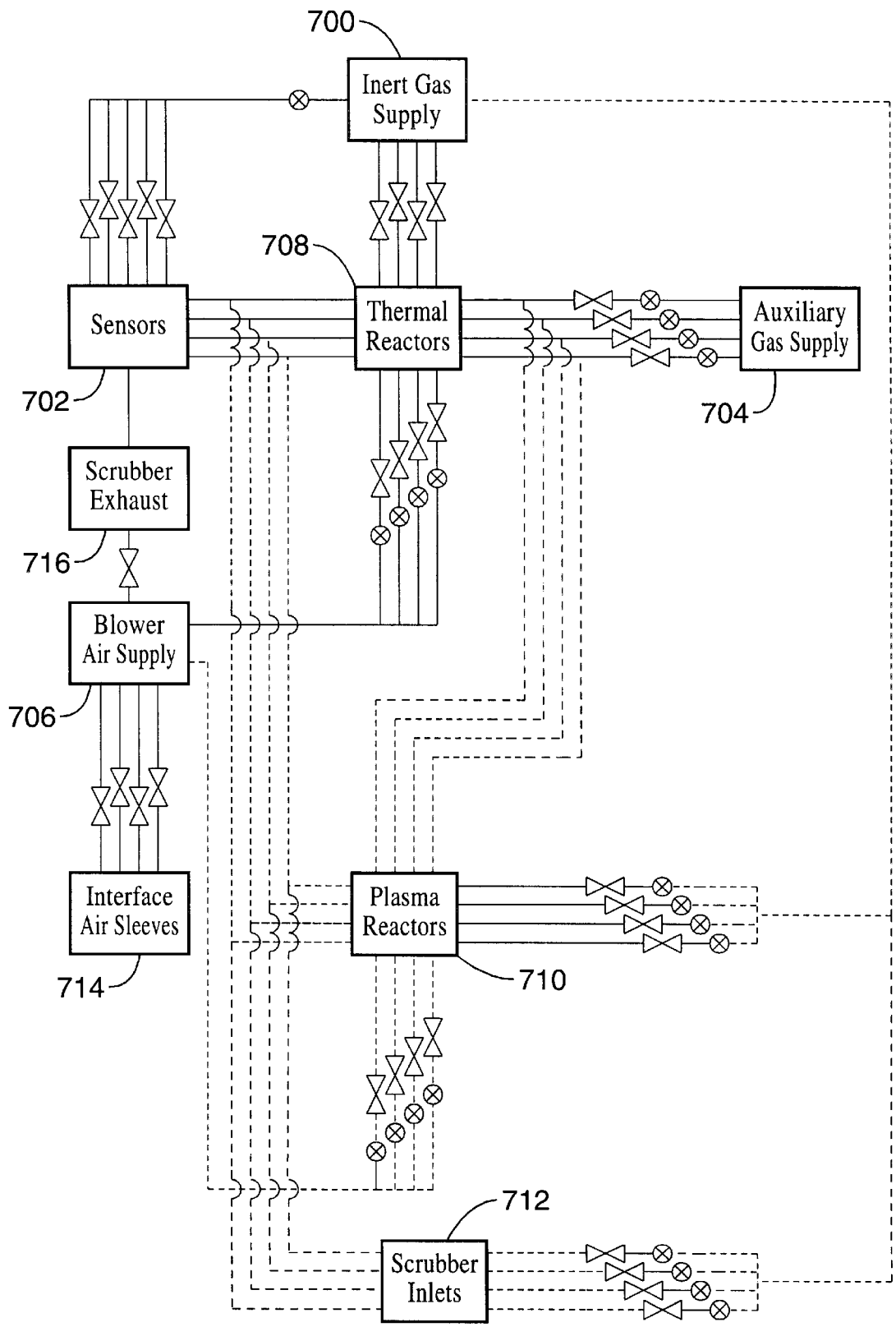
FIG. 31 is a block diagram of the system pneumatic flow according to an embodiment of the present invention.

FIG. 31 shows a flow diagram which exemplifies pneumatic flow within the modular abatement system. The pneumatic control subsystem includes inert gas purge 700, pressure sensors 702, auxiliary gas addition 704, and blower air supply 706. Inert gas purge 700 must be provided for the porous wall thermal reactors 708, plasma reactor 710, and the scrubber inlets 712. Therefore, individual purge lines include interchangeable restrictive flow orifices to accommodate component and process requirements, and shutoff valves to facilitate individual maintenance. Pressure sensors are used to monitor pressures on all process stream inlets, and to monitor air supply pressures to the porous wall thermal reactor 708 and the falling film plasma reactor 710. Monitoring process stream inlet pressure is important to allow diagnosing equipment problems and maintenance requirements. Auxiliary gases added to the porous wall thermal reactor and falling film plasma reactor promote additional reaction chemistries for treating the process streams. Enhanced reaction chemistries improve the efficiencies of the reactors and improve both the efficiencies and capacities of the subsequent inlet modules used for treating the combined process stream. For example, adding a reducing agent such as hydrogen to a process stream containing fluorine promotes hydrogen fluoride formation which is readily removed by wet scrubbing and minimizes the formation of oxygen-fluorine compounds which are difficult to remove by wet scrubbing. Individual auxiliary gas lines include interchangeable restrictive flow orifices to accommodate reactor and process requirements, and shutoff valves to facilitate individual maintenance. Air supply pressures are monitored across restrictive flow orifices which control air flow to the porous wall thermal reactors and falling film plasma reactors. Individual air lines include interchangeable restrictive flow orifices to accommodate reactor and process requirements, and shutoff valves to facilitate individual maintenance. Air flow to the universal cooling air sleeves is also controlled by interchangeable restrictive flow orifices 714. The cooling air requirement is determined by the reactor or inlet type and the process stream treatment requirement. Selecting nominal gas flows for treating individual process streams reduces the demands placed upon subsequent inlet modules used to treat the combined process stream.

Figure 32:
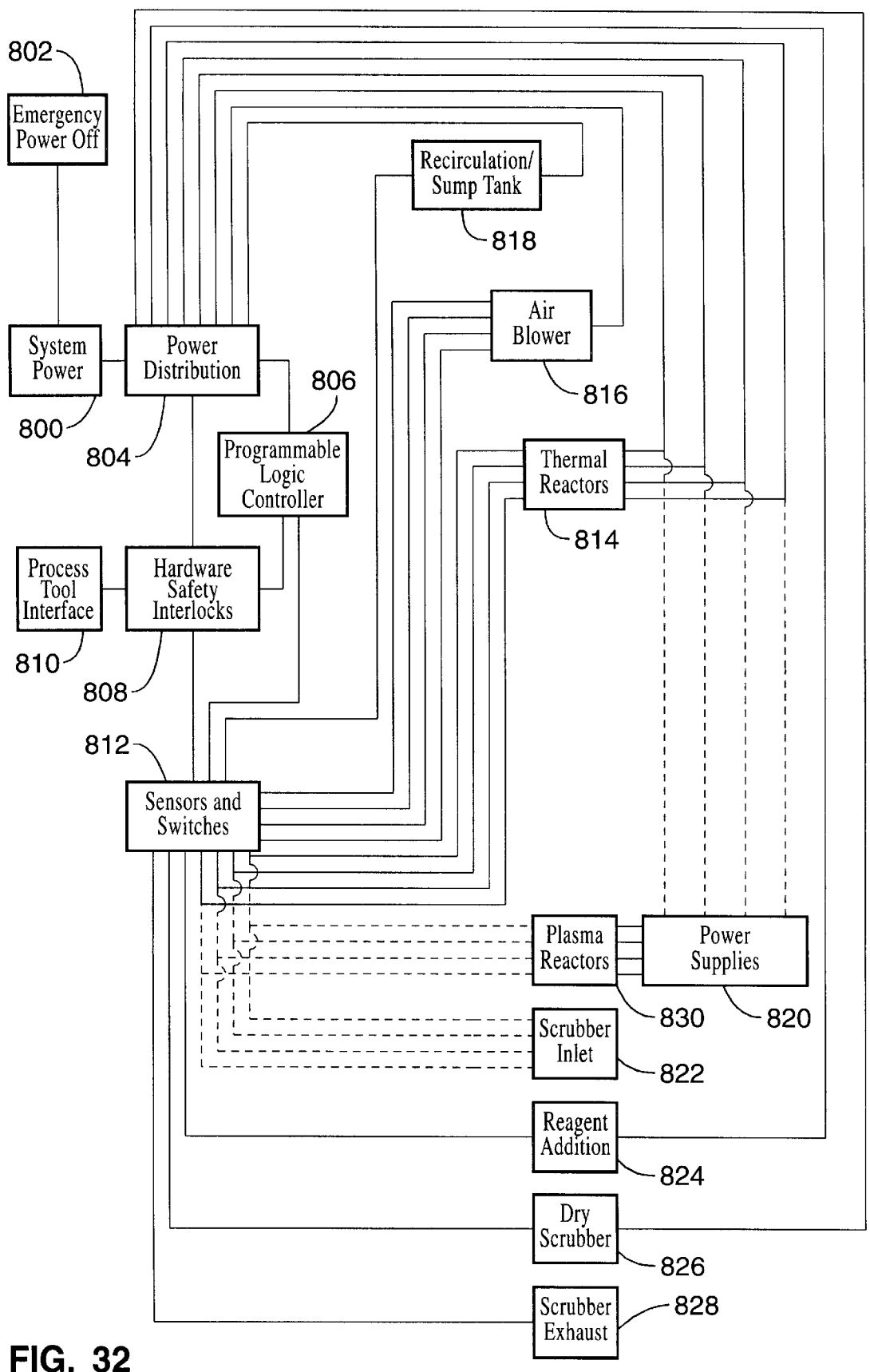
FIG. 32 is a block diagram of system electronics according to an embodiment of the present invention shown interconnected for controlling and monitoring the system.

FIG. 32 shows a block diagram which exemplifies electrical circuits and controls within the modular abatement system of the present invention. The electrical control subsystem includes the main power circuit 800, the emergency power off circuit 802, the power distribution modules 804, the programmable logic controller (PLC) 806, the hardware safety interlock modules 808, and the reactor power supply modules 820. The main power circuit 800 is designed to accommodate single and three phase power at various voltage levels. The emergency power off circuit 802 provides for immediate equipment shutdown and power isolation by an operator or critical fault interlock. Power distribution modules 804 tap into the main power circuit to breaker, interlock, and control power inputs to components and modules. The power distribution modules associated with the plasma reactors 830, thermal reactors 814, dry scrubber 826, reagent supplies 824, and scrubber exhaust 828 are interchangeable or removable to facilitate nominal equipment configuration or reconfiguration. The programmable logic controller 806 (PLC) utilizes a modular control program to recognize the installation of specific equipment modules and activate the requisite control routines. The sensors and switches 812 associated with specific subsystem and module operation and control interface to the PLC 806 and to the hardware safety interlock modules 808. Critical safety functions interface directly between specific sensors and switches, specific hardware safety interlock modules, and the specific power distribution modules. Reactor power control modules are required to provide specific power and control functions for the porous wall thermal reactor and for the falling film plasma reactor and associated components. Thus, the configuration, operation, safety, and performance integrity of the modular abatement system is ensured by the control subsystems.

It will be appreciated that the modular system of the present invention lends itself for use in an automated manufacturing environment. Specifically, the control system of the present modular abatement system may be connected to a process control computer (not shown), or a back-end server for manufacturing processes, such that the operation of the system may be monitored and properly coordinated with the processes for which process gas streams are being received. Furthermore, when configuring the system to correspond with the processes, each inlet module and other module or setting for use, can be provided with designator and called out by the process computer such that a technician need only pull out and attach the modules as called out to properly assemble the correct system for the process stream.

Accordingly, it will be seen that this invention provides a method and exemplifies a number of system embodiments and aspects which provide for the treatment of various process streams within the semiconductor manufacturing industry. It will be appreciated that the teachings of the invention may be practiced in numerous alternative ways and implementations without departing from the present invention.

Although the description above contains many specificities, these should not be construed as limiting the scope of the invention but as merely providing illustrations of some of the presently preferred embodiments of this invention. Thus the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A falling film plasma reactor using high voltage alternating current or pulsed direct current applied to radially spaced cylindrical electrodes to generate dielectric breakdown of a process gas within a large radial gap comprising a first inner electrode having an outer surface, a second outer electrode having an inner surface, and a liquid dielectric, wherein said liquid dielectric is configured to flow as a film over said outer surface of said first inner electrode, and said liquid dielectric is configured to flow as a film over said inner surface of said second outer electrode.

2. A falling film plasma reactor as recited in claim 1, wherein said dielectric liquid contacts said process gas within said large radial gap.

3. A falling film plasma reactor as recited in claim 2, wherein a reagent gas is introduced into said large radial gap.

4. A falling film plasma reactor as recited in claim 3, wherein said current causes a plasma which dissociates atoms and molecules of constituents of the said gas stream thereby causing a chemical reaction and creation of reaction products.

5. A falling film plasma reactor as recited in claim 4, wherein at least one of said reaction products is absorbed within said dielectric liquid.

6. A falling film plasma reactor as recited in claim 5, further comprising means for mixing said process gas with a cooling gas, wherein said process gas exiting said large radial gap is mixed with said cooling gas.

7. A falling film plasma reactor comprising radially spaced cylindrical electrodes, a liquid dielectric configured to prevent arcing between the electrodes and a large radial gap between the electrodes configured to allow the liquid dielectric to flow over at least one of said electrodes, and further configured to allow a process gas to contact, said liquid dielectric flowing over at least one of said electrodes.

* * * * *